United States Patent
Aitchison et al.

(10) Patent No.: US 7,141,095 B2
(45) Date of Patent: Nov. 28, 2006

(54) PRECURSOR MATERIAL DELIVERY SYSTEM FOR ATOMIC LAYER DEPOSITION

(75) Inventors: Bradley J. Aitchison, Eugene, OR (US); Jarmo Maula, Espoo (FI); Hannu Leskinen, Espoo (FI); Teemu Lang, Helsinki (FI); Pekka Kuosmanen, Espoo (FI); Kari Härkönen, Kauniainen (FI); Martti Sonninen, Espoo (FI)

(73) Assignee: Planar Systems, Inc., Beaverton, OR (US)

( * ) Notice: Subject to any disclaimer, the term of this patent is extended or adjusted under 35 U.S.C. 154(b) by 328 days.

(21) Appl. No.: 10/660,365

(22) Filed: Sep. 10, 2003

(65) Prior Publication Data

US 2004/0124131 A1 Jul. 1, 2004

Related U.S. Application Data

(63) Continuation-in-part of application No. 10/400,054, filed on Mar. 25, 2003, now Pat. No. 6,936,086.

(60) Provisional application No. 60/410,067, filed on Sep. 11, 2002.

(51) Int. Cl.
*B01D 45/04* (2006.01)
*C23C 16/00* (2006.01)

(52) U.S. Cl. .......... 95/273; 55/385.1; 55/428; 55/434; 55/435; 55/441; 55/442; 55/443; 55/446; 55/452; 55/459.1; 55/461; 55/462; 55/465; 55/DIG. 14; 118/715; 118/723 R; 118/724; 427/248.1; 427/255.23; 427/255.28; 427/255.7

(58) Field of Classification Search ........... 55/367, 55/308, 385.1, 428, 429, 434, 435, 439, 441, 55/442, 443, 444, 445, 446, 447, 452, 459.1, 55/452.3, 461, 462, 463, DIG. 14; 96/380, 96/384, 385, 386, 387; 210/512.1; 118/715, 118/719, 322, 723 R, 724, 726; 427/248.1, 427/255.23, 255.28, 255.29, 255.7; 95/273
See application file for complete search history.

(56) References Cited

U.S. PATENT DOCUMENTS

| 763,199 A | 6/1904 | Newton et al. ............... 55/433 |
| 3,062,220 A | 11/1962 | Brothers ...................... 55/442 |

(Continued)

FOREIGN PATENT DOCUMENTS

DE 1580 01 A1 4/1981

(Continued)

OTHER PUBLICATIONS

Cross section drawing of AlCl3 precursor supply system, Lohja Corporation, 2 pages (unpublished).

(Continued)

*Primary Examiner*—Jason M. Greene
(74) *Attorney, Agent, or Firm*—Stoel Rives LLP

(57) ABSTRACT

A precursor delivery system includes a flow path from a precursor container to a reaction space of a thin film deposition system, such as an atomic layer deposition (ALD) reactor. A staging volume is preferably established between the precursor container and the reaction space for receiving at least one dose of the precursor material from the precursor container, from which a series of pulses is released toward the reaction space. The precursor material is typically vaporized after loading it in the precursor container by heating or reducing the pressure inside the precursor container. A vacuum line is preferably coupled to the precursor container and bypasses the reaction space for reducing pressure inside the precursor container without drawing particles into the reaction space. A high conductivity particle filter having inertial traps may be included, preferably between the precursor container and a staging volume, for filtering particles from the precursor material.

36 Claims, 9 Drawing Sheets

U.S. PATENT DOCUMENTS

| | | | |
|---|---|---|---|
| 3,446,936 A | | 5/1969 | Hanson et al. |
| 3,466,424 A | | 9/1969 | Adams |
| 3,541,768 A | | 11/1970 | Labadie .................. 55/433 |
| 3,559,760 A | | 2/1971 | Ninomiya .................. 60/311 |
| 3,805,495 A | | 4/1974 | Steel .................. 55/435 |
| 3,808,035 A | | 4/1974 | Stelter |
| 3,900,597 A | | 8/1975 | Chruma et al. |
| 4,002,880 A | | 1/1977 | Davey et al. |
| 4,058,430 A | | 11/1977 | Suntola et al. |
| 4,155,359 A | | 5/1979 | Zagorski .................. 55/459.1 |
| 4,228,004 A | * | 10/1980 | Foster .................. 118/715 |
| 4,389,973 A | | 6/1983 | Suntola et al. |
| 4,413,022 A | | 11/1983 | Suntola et al. |
| 4,419,107 A | | 12/1983 | Roydhouse .................. 55/446 |
| 4,435,199 A | * | 3/1984 | Potkay .................. 55/441 |
| 4,606,739 A | | 8/1986 | Brannstrom .................. 55/435 |
| 4,615,715 A | | 10/1986 | Seshamani .................. 55/435 |
| 4,735,633 A | | 4/1988 | Chiu |
| 4,895,707 A | | 1/1990 | Kuhn .................. 55/461 |
| 4,971,100 A | | 11/1990 | Ohmi |
| 5,166,092 A | | 11/1992 | Mochizuki et al. |
| 5,279,723 A | * | 1/1994 | Falabella et al. .................. 427/580 |
| 5,362,328 A | | 11/1994 | Gardiner et al. |
| 5,399,379 A | | 3/1995 | Sandhu |
| 5,417,236 A | | 5/1995 | Moore et al. |
| 5,438,952 A | | 8/1995 | Otsuka |
| 5,451,258 A | | 9/1995 | Hillman et al. |
| 5,455,014 A | | 10/1995 | Costantino et al. |
| 5,547,708 A | | 8/1996 | Asaba et al. |
| 5,554,226 A | | 9/1996 | Okase et al. |
| 5,601,107 A | | 2/1997 | Moore et al. |
| 5,620,524 A | | 4/1997 | Fan et al. |
| 5,657,786 A | | 8/1997 | DuRoss et al. |
| 5,681,613 A | | 10/1997 | Hansen |
| 5,709,753 A | | 1/1998 | Olson et al. |
| 5,857,326 A | | 1/1999 | Blanchet .................. 55/457 |
| 5,912,368 A | | 6/1999 | Satarino et al. .................. 55/443 |
| 5,966,499 A | | 10/1999 | Hinkle et al. |
| 6,066,209 A | | 5/2000 | Sajoto et al. |
| 6,077,718 A | | 6/2000 | Takasu et al. |
| 6,090,208 A | | 7/2000 | Han |
| 6,193,802 B1 | * | 2/2001 | Pang et al. .................. 118/715 |
| 6,210,485 B1 | | 4/2001 | Zhao et al. .................. 118/724 |
| 6,258,171 B1 | | 7/2001 | Agarwal |
| 6,261,374 B1 | | 7/2001 | Bang et al. |
| 6,270,839 B1 | | 8/2001 | Onoe et al. |
| 6,354,241 B1 | * | 3/2002 | Tanaka et al. .................. 118/723 E |
| 6,409,839 B1 | | 6/2002 | Sun et al. |
| 6,718,126 B1 | * | 4/2004 | Lei .................. 427/255.23 |
| 6,915,592 B1 | * | 7/2005 | Guenther .................. 118/715 |
| 2001/0042523 A1 | * | 11/2001 | Kesala .................. 427/248.1 |
| 2001/0054377 A1 | | 12/2001 | Lindfors et al. .................. 117/104 |
| 2002/0007796 A1 | * | 1/2002 | Gorokhovsky .................. 118/723 ER |
| 2005/0016453 A1 | * | 1/2005 | Seidel et al. .................. 118/715 |
| 2005/0072357 A1 | * | 4/2005 | Shero et al. .................. 118/715 |

FOREIGN PATENT DOCUMENTS

| | | |
|---|---|---|
| EP | 0 135 488 A2 | 3/1985 |
| EP | 0 307 995 | 2/1988 |
| WO | WO 01/45158 | 9/2001 |

OTHER PUBLICATIONS

Invitation to pay Addition Fees in corresponding International application No. PCT/US03/28436, Feb. 2, 2004, 5 pages.

* cited by examiner

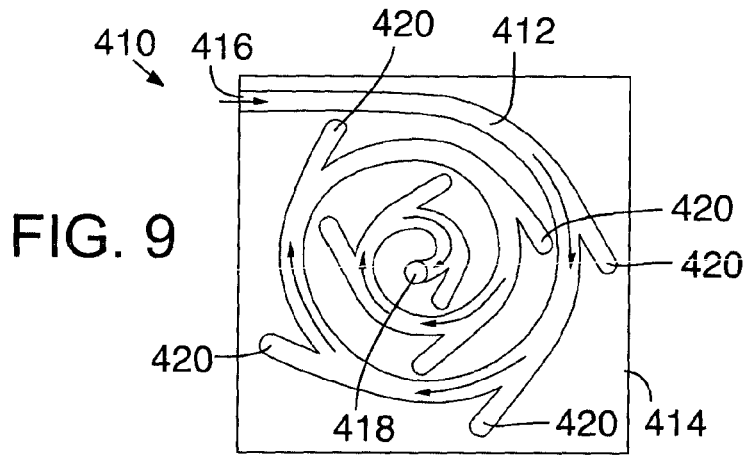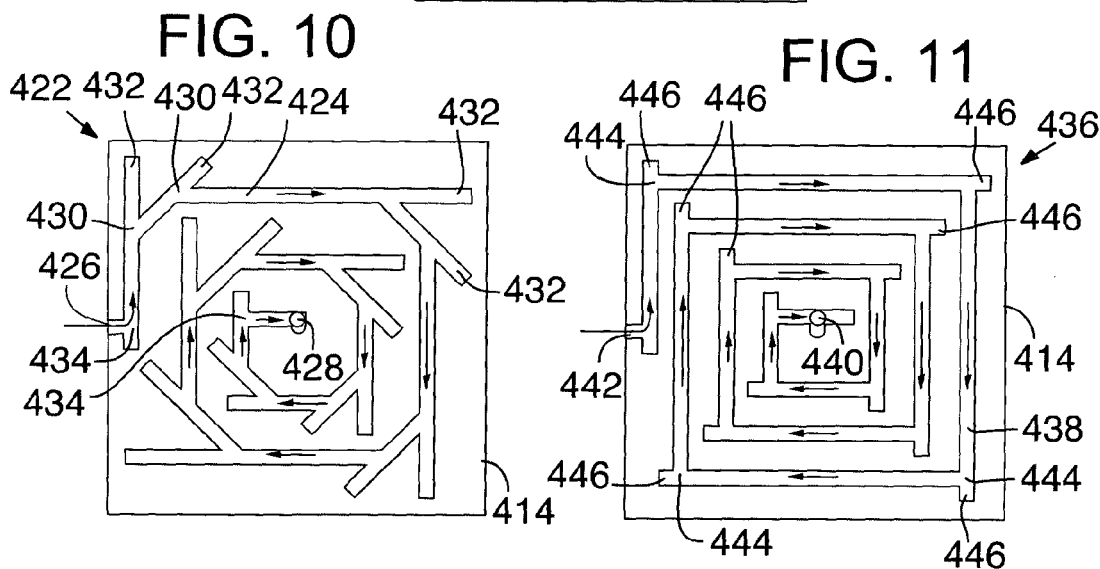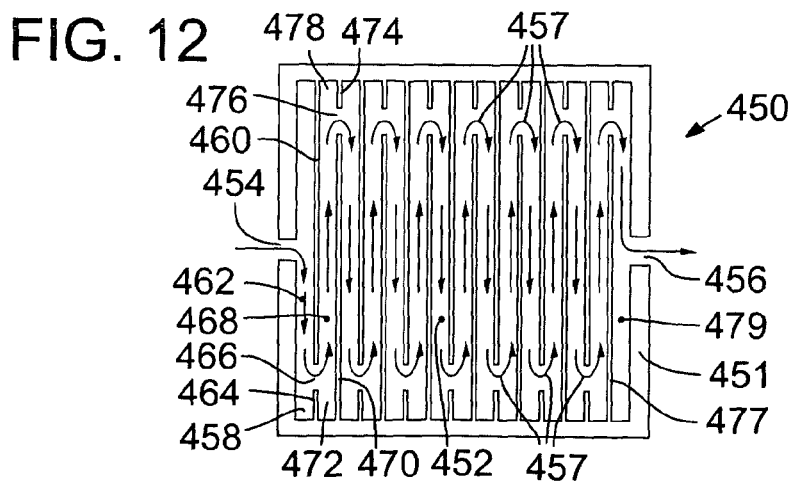

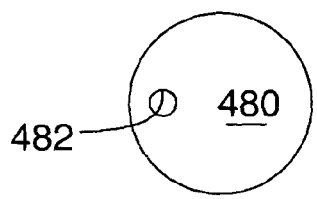
FIG. 13A
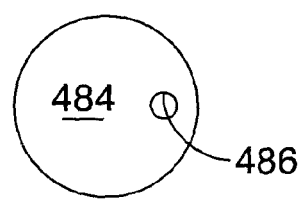
FIG. 13B
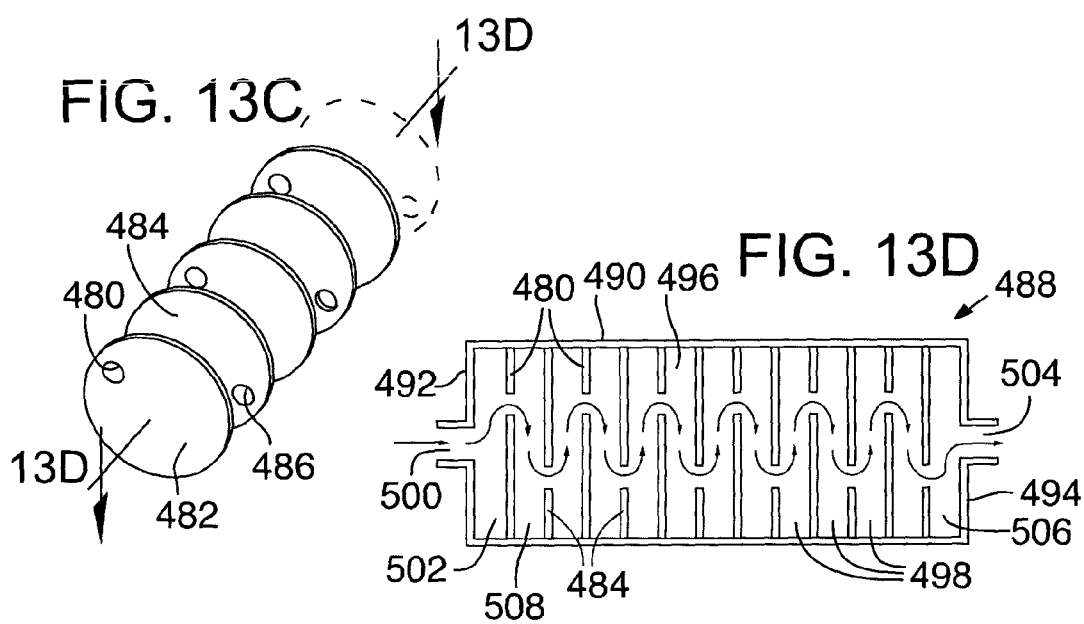
FIG. 13C
FIG. 13D
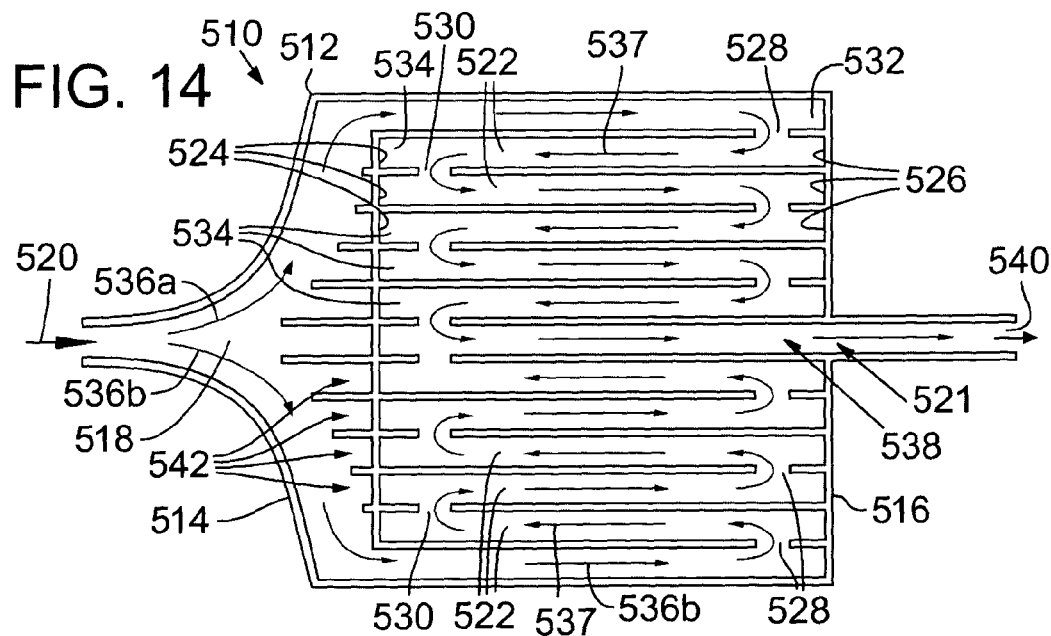
FIG. 14

PRECURSOR MATERIAL DELIVERY SYSTEM FOR ATOMIC LAYER DEPOSITION

RELATED APPLICATIONS

This application claims the benefit under 35 U.S.C. § 119(e) of U.S. Provisional Patent Application No. 60/410,067, filed Sep. 11, 2002, and is a continuation-in-part of U.S. patent application Ser. No. 10/400,054, filed Mar. 25, 2003, now U.S. Pat. No. 6,936,086 both of which are incorporated herein by reference.

TECHNICAL FIELD

The field of the present invention relates to methods and devices for storing precursor materials in a thin film deposition process, such as atomic layer deposition; conditioning such precursor materials in preparation for deposition, e.g., by adjusting their temperature and/or pressure; and introducing pulses of vaporized precursor material into a reaction space of a thin film deposition system.

BACKGROUND OF THE INVENTION

Atomic layer deposition ("ALD"), formerly known as atomic layer epitaxy ("ALE"), is a thin film deposition process that has been used to manufacture electroluminescent ("EL") displays for over 20 years. See, e.g., U.S. Pat. No. 4,058,430 of Suntola et al., incorporated herein by reference. The films yielded by the ALD technique have exceptional characteristics such as being pinhole free and possessing almost perfect step coverage. Recently, ALD has been proposed for use in the semiconductor processing industry for depositing thin films on semiconductor substrates, to achieve desired step coverage and physical properties needed for next-generation integrated circuits. ALD offers several benefits over other thin film deposition methods commonly used in semiconductor processing, such as physical vapor deposition ("PVD") (e.g., evaporation or sputtering) and chemical vapor deposition ("CVD"), as described in *Atomic Layer Epitaxy* (T. Suntola and M. Simpson, eds., Blackie and Son Ltd., Glasgow, 1990).

In contrast to CVD, in which the flows of precursors are static (i.e., flow rates are steady during processing), precursor flows in ALD processing are dynamic. There are many precursor delivery system components, such as mass flow controllers and particle filters, that can be used in CVD processing in which flow resistance and switching speed are not especially important. However, the inventors have recognized that such delivery system components have limited utility in ALD processes and equipment, due to the dynamic precursor flows and fast switching needed in ALD.

Successful ALD growth typically requires the sequential introduction of two or more different precursor vapors into a reaction space around a substrate. ALD is usually performed at elevated temperatures and pressures. For example, the reaction space may be heated to between 200° C. and 600° C. and pumped down to a pressure of approximately 1 Torr. In a typical ALD reactor, the reaction space is bounded by a reaction chamber sized to accommodate one or more substrates. One or more precursor material delivery systems (also known as "precursor sources") are typically provided for feeding precursor materials into the reaction chamber.

After the substrates are loaded into the reaction chamber and heated to a desired processing temperature, a first precursor vapor is directed over the substrates. Some of the precursor vapor chemisorbs on the surface of the substrates to make a one monolayer thick film. For true ALD, the molecules of precursor vapor will not attach to other like molecules and the process is therefore self-limiting. Next the reaction space is purged to remove excess of the first vapor and any volatile reaction products. Purging is typically accomplished by introduction of an inert purge gas into the reaction space. After purging, a second precursor vapor is introduced. Molecules of the second precursor vapor chemisorb or otherwise react with the chemisorbed first precursor molecules to form a thin film product of the first and second precursors. To complete the ALD cycle, the reaction space is again purged to remove any excess of the second vapor as well as any volatile reaction products. The steps of first precursor pulse, purge, second precursor pulse, and purge are typically repeated hundreds or thousands of times until the desired thickness of the film is achieved.

A key to successful ALD growth is to have the first and second precursor vapors pulsed into the reaction chamber sequentially and without overlap. An ideal set of ALD precursor pulses would be a pair of Delta functions, as illustrated in FIG. 1, which is a simplified timing diagram representing two cycles of a simple ALD process. With reference to FIG. 1, alternating pulses of a first precursor 12 and a second precursor 14 are separated by intervals 16, which can be made small compared to the duration "d" of each of the pulses 12 and 14. For simplicity of illustration, the pulses 12 and 14 are shown in FIG. 1 as having equal duration, but unequal pulse durations would also be feasible.

As noted above, FIG. 1 illustrates an ideal set of precursor pulses. However, in practice, imperfections in the precursor delivery system, precursor adsorption on the walls of the delivery system and reaction chamber, and fluid flow dynamics cause the concentration of precursor material in the ALD reaction space to have a leading edge slope and an exponential decay during purge. FIG. 2 is a simplified timing diagram illustrating respective first and second pulses 22 and 24 in an ALD reactor, each with a leading edge slope 26 and exponential decay 28. With reference to FIG. 2, because the actual pulses 22 and 24 are not Delta functions, they will overlap if the second precursor pulse 24 is started before the first precursor pulse 22 is completely decayed, as illustrated by overlap region 29. If substantial amounts of both of the first and second precursor chemicals are present in the reaction space at the same time, then non-ALD growth can occur, which can generate particles, non-uniform film thickness, and other defects. To prevent the problems caused by non-ALD growth, the pulses 22 and 24 are desirably separated by a purge interval that is long enough to prevent overlap 29.

FIG. 3 illustrates a purge interval 32, between respective first and second precursor pulses 34 and 36, that is sufficiently long to prevent overlap. For simplicity, the purge interval 32 is illustrated as having a duration similar to the duration of the pulses 34 and 36. However, in practice, it is common for purge times in an ALD process to be 10 times longer than the pulse times, due to long exponential decays of precursor pulses caused by flow restrictions and cold spots in the flow path. For example, a ALD process including precursor vapor pulses having a duration of 50 milliseconds (ms) may require pulse intervals of 500 ms or longer to prevent overlap and achieve good film thickness uniformity. Long purge intervals increase processing time, which substantially reduces the overall efficiency of the ALD reactor. The present inventors have recognized that reducing the rise and decay times also reduces the overall time required for each ALD process cycle without causing non-ALD growth, thereby improving the throughput of the ALD reactor.

Conventionally, precursors have been stored and vapors delivered from glass tubes placed inside the reactor, as described in U.S. Pat. No. 4,389,973 of Suntola et al., incorporated herein by reference. The flow of each precursor vapor is controlled by so-called "inert gas valving," which involves controlling the direction of an inert gas flowing through the tube containing the precursor chemical. Conventional inert gas valving has been employed for about 20 years for the fabrication of EL displays, including its use with certain solid precursors like $ZnCl_2$ and $MnCl_2$. However, the present inventors have found that the particle requirements for other applications, particularly semiconductor processing, are far more stringent than those required for EL display manufacturing. Conventional precursor delivery methods and inert gas valving do not provide a barrier to prevent particles present in powdered precursors from being carried into the reaction space with the pulses of precursor vapor. Further, the conventional methods cannot accommodate certain highly reactive precursors useful for semiconductor processing, which cannot be loaded in an open tube due to their reactivity with air and/or moisture.

For most films grown by ALD, unwanted particles in or on the film will reduce the manufacturing yield. It is therefore important that the precursor delivery system does not emit particles. Preventing particles is especially difficult when one or more of the precursors exist in powdered form at room temperature and pressure. CVD systems commonly include a high efficiency particle filter that can block up to 99.99999% of particles smaller than 0.003 microns. However, the present inventors have found that CVD-type high efficiency particle filters are unsuitable for use in ALD processing because they are highly resistive to flow, which leads to long precursor rise and/or decay times. High efficiency particle filters also have a tendency to become blocked by coarse particles emanating from a supply of precursor material, which can cause system failures and yield losses in manufacturing. A new type of ALD-oriented particle filtering is therefore needed.

The inventors have also recognized a need for improved control of unwanted precursor migration between pulses (during purging).

U.S. Patent Application Publication No. 2001/0042523 A1 of Kesala discloses a reactant gas source contained in a vacuum shell. Liquid or solid reactant matter is held in an ampoule having an opening covered by a high efficiency particle filter. The ampoule is enclosed within a gas-tight container that defines a gas space around the ampoule. An outlet of the gas-tight container leads from the gas space through a second high efficiency particle filter and into the reaction chamber. Pulses of reactant gases are switched by a backflow of inert gas in a line between the second high efficiency particle filter and the reaction chamber. Flow resistance of the second high efficiency particle filter and a capacitance effect of the gas-tight container can cause long decay times for the pulses of reactant.

U.S. Pat. No. 6,270,839 of Onoe at el. discloses a precursor source for a CVD system that does not include a mechanism for pulsing, as required in an ALD system.

Thus the inventors have recognized a need for improved methods and devices for storing precursor materials in a thin film deposition process, conditioning such precursor materials in preparation for deposition, and introducing pulses of vaporized precursor material into a reaction space of a thin film deposition system.

SUMMARY OF THE INVENTION

In accordance with the invention, a precursor delivery system for delivering pulses of precursor material to a reaction space in a thin film deposition system includes a precursor container for holding a supply of precursor material and a flow path from the precursor container to the reaction space. In a preferred embodiment, a pulse control device is interposed between the precursor container and the reaction space for selectively permitting pulses of the precursor material to flow from the precursor container to the reaction space via the flow path. In some embodiments, a staging volume may be established downstream from the precursor container and upstream from the reaction space for receiving at least one dose of the precursor material from the precursor container. The staging volume is preferably selectively isolatable from the reaction space for releasing a series of pulses of the precursor material from the staging volume toward the reaction space. The staging volume may also be selectively isolatable from the precursor container. One or more sensors may optionally be coupled to the staging volume for sensing a physical condition of the staging volume or the precursor material present in it, such as temperature or pressure, for monitoring system performance and/or providing feedback to an automatic controller of the precursor delivery system for closed-loop control.

The precursor material is preferably vaporized after loading it in the precursor container by heating the precursor material or reducing pressure inside the precursor container. A vacuum line may be coupled to the precursor container for reducing pressure inside the precursor container. The vacuum line preferably bypasses a reaction chamber of the thin film deposition system to prevent particles from being drawn through the flow path and into the reaction chamber. The vaporized precursor material (hereinafter "precursor vapor") may be drawn into the staging volume, via a pressure differential, upon opening an optional isolation valve between the precursor container and the staging volume. A particle filter is preferably interposed in the flow path between the precursor container and the reaction space, and more preferably between the precursor container and a staging volume, for filtering particles from the precursor vapor.

The particle filter may include a high conductivity particle filter for preventing the particles from passing into the reaction space without significantly restricting the flow of the pulses through the flow path. In a preferred embodiment, the high conductivity particle filter defines a filter passage having multiple turns, at least one of which passes near a trap in communication with the filter passage such that the inertia of the particles causes them to travel into the trap as the precursor material flows through said turn. The particle filter may also comprise a compound filter including one or more high efficiency filters downstream from a high conductivity particle filter. In the compound filter arrangement, the high conductivity particle filter operates to remove coarse particles before the precursor reaches the high efficiency filters, thereby protecting the high efficiency filters from clogging.

Methods and devices in accordance with the preferred embodiments may be useful in atomic layer deposition ("ALD"), as well as for other pulsed thin film deposition techniques, such as pulsed chemical vapor deposition ("Pulsed-CVD") and pulsed metal-organic chemical vapor deposition ("Pulsed-MOCVD"), for example.

Additional aspects and advantages of this invention will be apparent from the following detailed description of preferred embodiments, which proceeds with reference to the accompanying drawings.

BRIEF DESCRIPTION OF THE DRAWINGS

Non-exhaustive embodiments are described with reference to the figures, in which like reference numerals identify like elements.

FIGS. 9–16 show various embodiments of a high conductivity particle filter used in the precursor delivery system of FIGS. 4–6, of which:

FIG. 9 is a cross-sectional view of one embodiment;

FIG. 10 is a cross-sectional view of an alternative embodiment;

FIG. 11 is a cross-sectional view of a second alternative embodiment;

FIG. 12 is a cross-sectional view of a third alternative embodiment;

FIG. 13A is a plan view of a first plate for another alternative embodiment;

FIG. 13B is a plan view of a second plate for use with the plate of FIG. 13A;

FIG. 13C is a perspective view of plates of FIGS. 13A and 13B arranged sequentially;

FIG. 13D is a cross-sectional view of a filter incorporating the plates of FIGS. 13A and 13B arranged sequentially as shown in FIG. 13C;

FIG. 14 is a cross-sectional view of an alternative embodiment;

FIG. 15 is a cross-sectional perspective view of yet another alternative embodiment; and FIG. 16 is a cross-sectional view of still another alternative embodiment.

DETAILED DESCRIPTION OF PREFERRED EMBODIMENTS

Throughout the specification, reference to "one embodiment," or "an embodiment," or "some embodiments" means that a particular described feature, structure, or characteristic is included in at least one embodiment. Thus appearances of the phrases "in one embodiment," "in an embodiment," or "in some embodiments" in various places throughout this specification are not necessarily all referring to the same embodiment. Furthermore, the described features, structures, or characteristics may be combined in any suitable manner in one or more embodiments.

As used herein, terminology referring to "communication" or "fluid communication" between components is inclusive of both a direct connection between components and an indirection connection in which such communication is effected via one or more intermediate components or pathways.

Furthermore, the described features, structures, characteristics, and methods may be combined in any suitable manner in one or more embodiments. Those skilled in the art will recognize that the various embodiments can be practiced without one or more of the specific details or with other methods, components, materials, etc. In other instances, well-known structures, materials, or operations are not shown or not described in detail to avoid obscuring aspects of the embodiments.

System Overview

Figure 1:
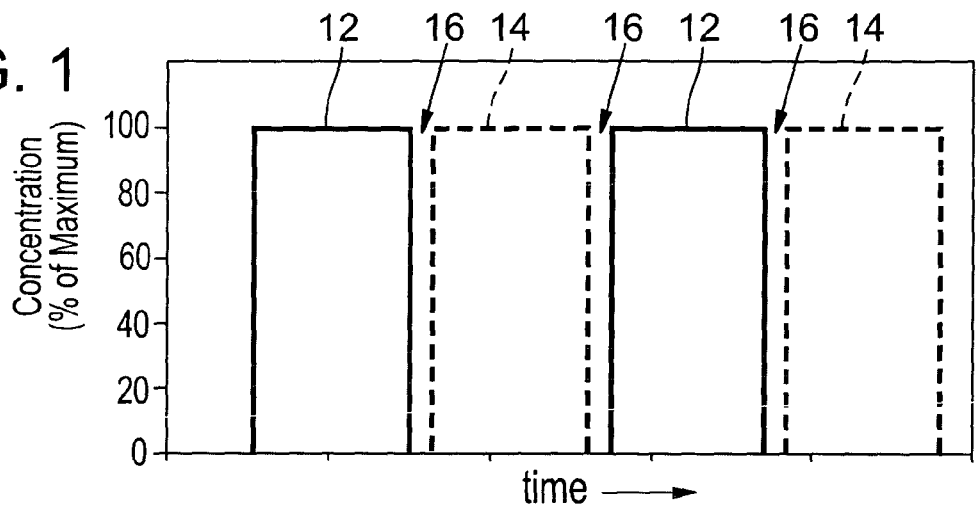
FIG. 1 is a simplified timing diagram representing two cycles of an idealized thin film deposition process.
Figure 2:
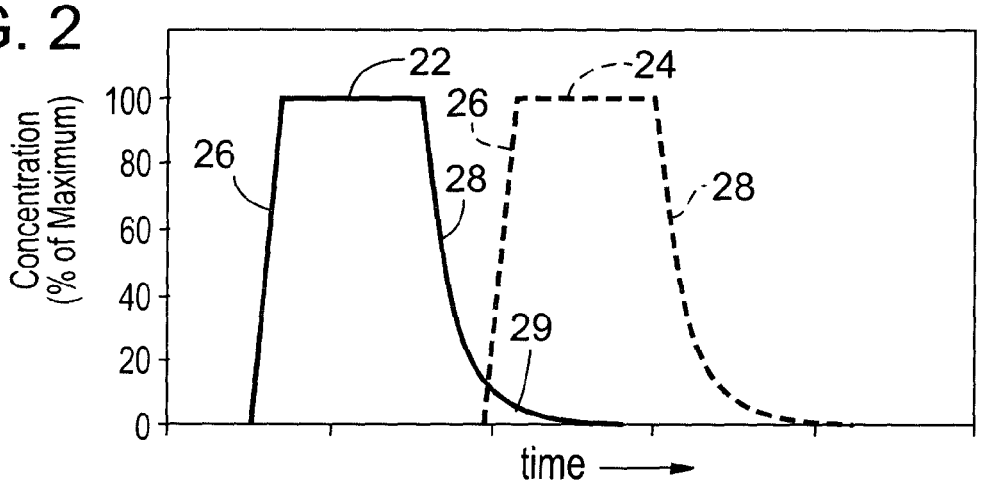
FIG. 2 is a timing diagram illustrating overlapping first and second precursor pulses in a simplified prior art ALD process, which may cause non-ALD film growth.
Figure 3:
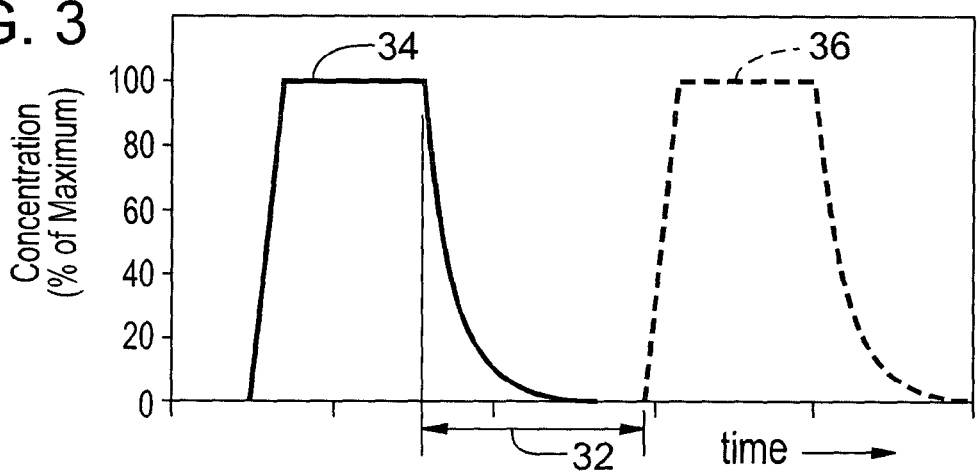
FIG. 3 is a timing diagram illustrating a simplified prior art ALD process, in which a purge interval prevents overlapping of sequential first and second precursor pulses.
Figure 4:
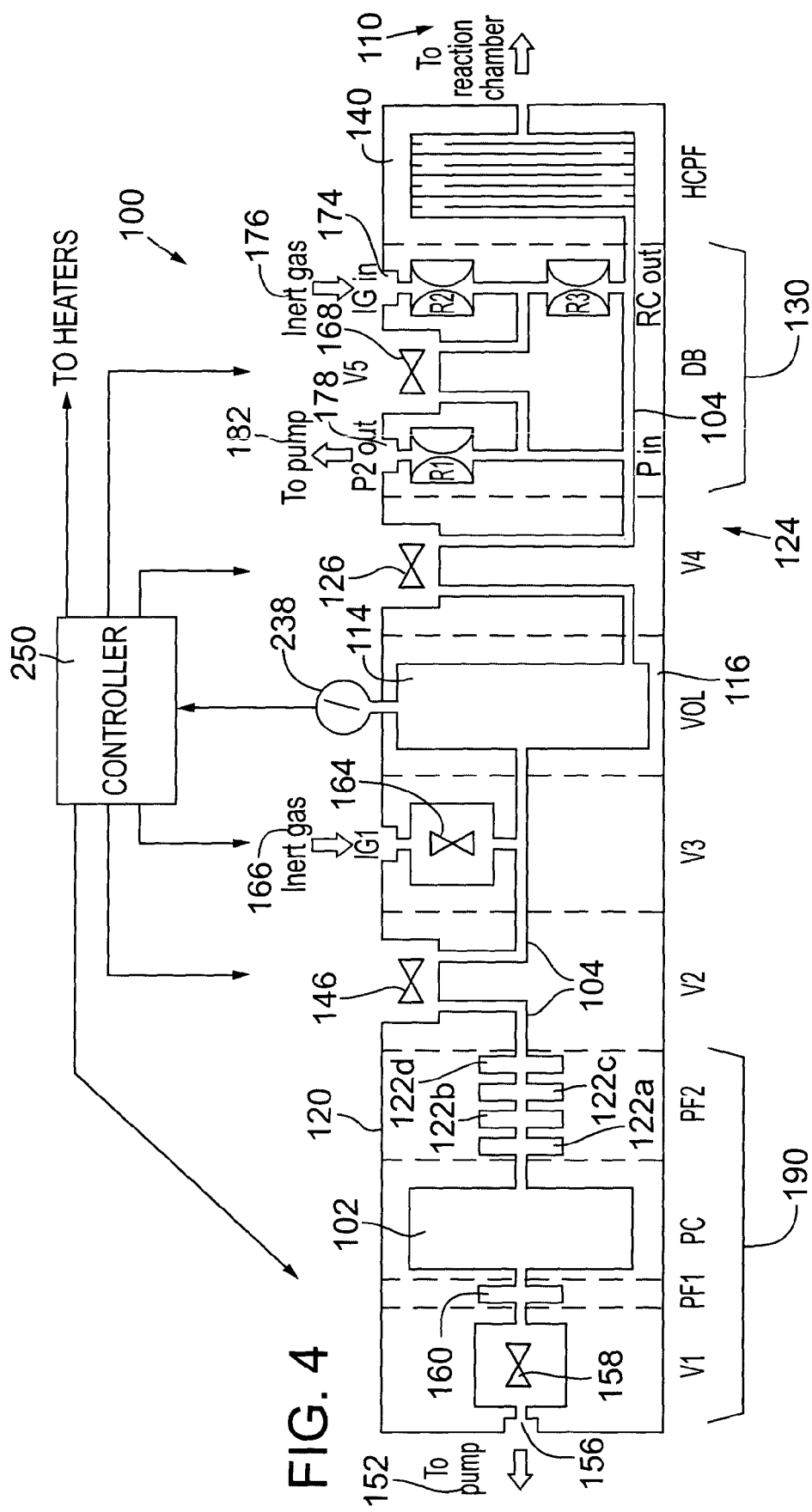
FIG. 4 is a schematic representation of a precursor delivery system in accordance with a preferred embodiment.
Figure 5:
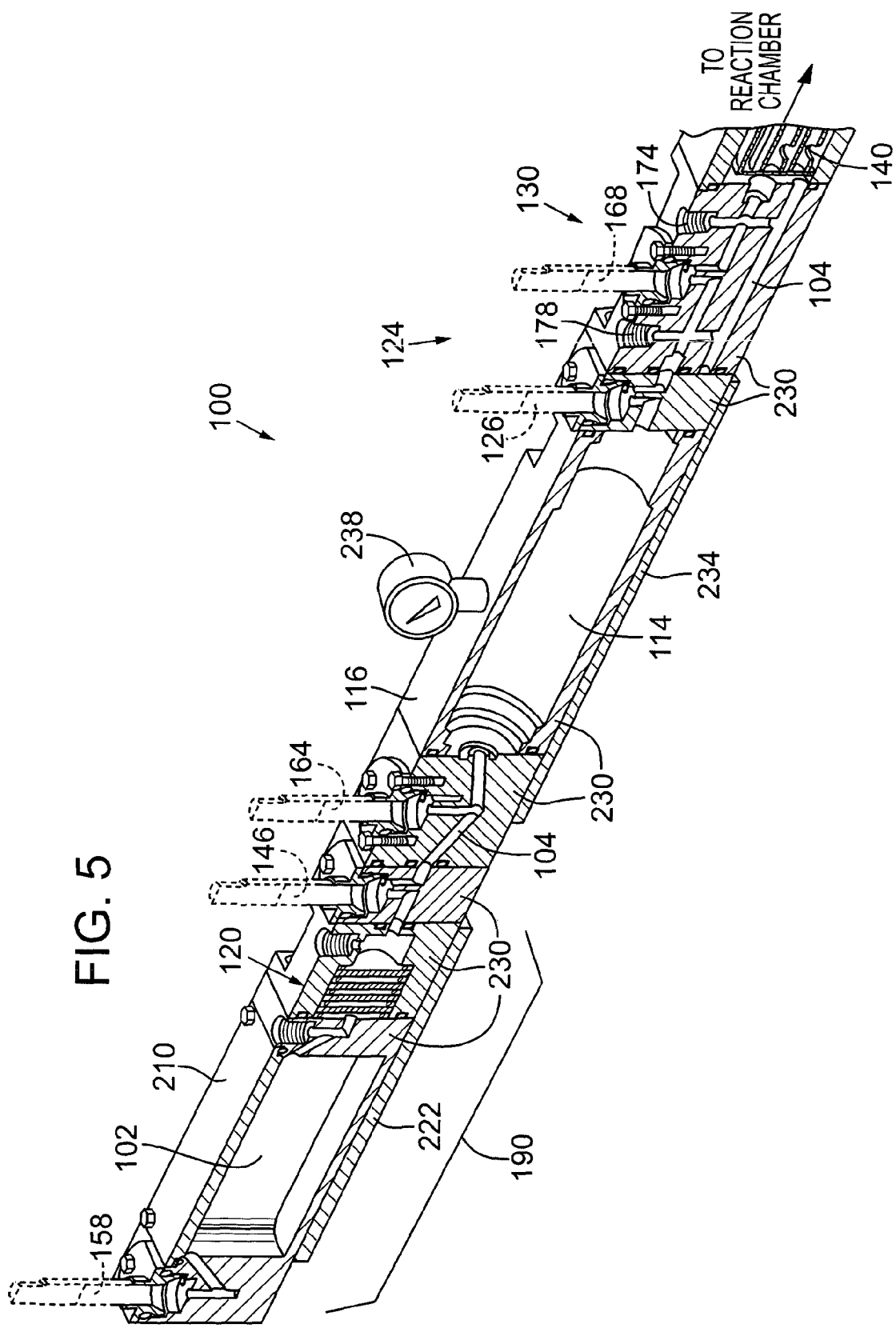
FIG. 5 is an isometric section view illustrating an embodiment of the precursor delivery system of FIG. 4.

FIG. 4 shows an schematic representation of a precursor delivery system 100 in accordance with a preferred embodiment. FIG. 5 is an isometric cross section view illustrating an embodiment of the precursor delivery system 100 of FIG. 4. With reference to FIGS. 4 and 5, a supply of precursor material (not shown) is stored in a precursor container (PC) 102, where it is preferably vaporized before flowing through a flow path 104 of the system 100 and into a reaction space inside a reaction chamber 110 of a thin film deposition system. Precursor material may originate as a solid, liquid, gas, or mixtures thereof, although it will most commonly be in powdered or liquid form when initially loaded into precursor container 102. When the precursor material originates in gaseous form, it is typically unnecessary to take steps for vaporizing the precursor material, such as heating or pressure reduction in precursor container 102. Valves V1, V2, V3, and V4 are used to regulate the pressure at different stages in precursor delivery system 100 and to control the flow of precursor material, as further described below. For clarity, the details of valves V1, V2, V3, and V4 are omitted and, in FIGS. 5 and 6, the valve stems and valve actuators of the valves are merely outlined in dashed lines. Any of a variety of diaphragm valves, fast-switching shut-off valves, or other flow shut-off mechanisms may be used. A preferred diaphragm valve is described in U.S. patent application Ser. No. 10/609,134, filed Jun. 26, 2003, incorporated herein by reference.

A staging volume (VOL) 114 is defined by the walls of a volume module 116, which is interposed in flow path 104 downstream from precursor container 102 and upstream from reaction chamber 110. Staging volume 114 is selectively isolatable from precursor container 102 and reaction chamber 110 for receiving and holding at least one dose of precursor material from which one or more pulses of precursor vapor may be released through flow path 104 and into reaction chamber 110. A particle filter module (PF2) 120 prevents particles from being transported into staging volume 114 when it receives a dose of the precursor from precursor container 102. Particle filter module 120 may include a high conductivity particle filter, as described below; a high efficiency filter; or a compound filter including a high conductivity particle filter followed by a series of one or more high efficiency filters. In the embodiment of FIGS. 4 and 5, particle filter module 120 includes a series of four filters 122a, 122b, 122c, and 122d arranged in flow path 104, of which the first filter 122a is a high conductivity filter and the second, third, and fourth filters 122b, 122c, 122d are high efficiency filters. The high conductivity filter of the first filter 122a may preferably be of the type described below with reference to FIGS. 9–11, including a spiraling filter passage flanked by a series of inertial traps. In some embodiments, filters 122a, 122b, 122c, and 122d comprise filters of progressively increasing efficiency to prevent clogging. For example, the first filter 122a may be the coarsest filter and the last filter may be the finest. In other embodiments (not shown), particle filter module 120 may include a greater or fewer number of filters in series.

A fast switching pulse control device 124 includes a pulse valve (V4) 126 for controlling the timing and duration of pulses of precursor material released into reaction chamber 110. Pulse valve 126 may include a diaphragm valve for selectively interrupting flow path 104. A suitable diaphragm valve is described in U.S. patent application Ser. No. 10/609,134, filed Jun. 26, 2003, which is incorporated herein by reference. In alternative embodiments (not shown), pulse control device 124 includes other devices for releasing pulses of precursor vapor, such as an inert gas valve. Pulse control device 124 preferably includes a diffusion barrier (DB) 130 positioned in the precursor flow path between pulse valve 126 and reaction chamber 110. One purpose of diffusion barrier 130 is to purge flow path 104 and reaction chamber 110 between pulses by injecting an inert gas such as nitrogen ($N_2$) into flow path 104 at a location upstream from reaction chamber 110 and downstream from pulse valve 126. Diffusion barrier 130 also operates so that any precursor material that might leak through pulse valve 126, when closed, is prevented from diffusing into reaction chamber 110 and reacting with a different precursor material being delivered into reaction chamber 110 by a second precursor delivery system (not shown).

In one embodiment, a high conductivity particle filter (HCPF) 140 is the last component in flow path 104 of precursor delivery system 100 before reaction chamber 110 to prevent particles from reaching reaction chamber 110. High conductivity particle filters may also be placed at other locations along flow path 104, to prevent particles from clogging or fouling valves, high efficiency particle filters, and other components of precursor delivery system 100.

An isolation valve (V2) 146 is positioned downstream from particle filter module 120 and upstream from volume module 116 for selectively isolating staging volume 114 from precursor container 102. Isolation valve 146 may include a diaphragm valve for selectively interrupting flow path 104 between staging volume 114 and precursor container 102. A suitable diaphragm valve is described in U.S. patent application Ser. No. 10/609,134. A pump 152 is coupled to precursor container 102 and can draw a vacuum within precursor container 102 independently of vacuum drawn at other locations in precursor delivery system 100 or the thin film deposition reactor. A vacuum path 156 between precursor container 102 and pump 152 is selectively opened and closed by a vacuum valve (V1) 158. Vacuum valve 158 may include a diaphragm valve for selectively interrupting vacuum path 156, such as the diaphragm valve described in U.S. patent application Ser. No. 10/609,134. Pump 152 may be the same pumps used to reduce the pressure in the reaction chamber 110 or independent pumps, but vacuum path 156 preferably bypasses reaction chamber 110 so that any particles drawn into vacuum path 156 from precursor chamber 102 will not pass through reaction chamber 110. By bypassing reaction chamber 110, vacuum path 156 also facilitates the use of less expensive precursor chemicals because it allows high vapor pressure contaminants and byproducts, such as water, to be removed from the supply of precursor material without contaminating the reaction space 110. Isolation valve 146 preferably prevents the portion of flow path 104 located downstream from isolation valve 146 from the effects of pumps 152. Vacuum valve 158 and isolation valve 146 may cooperate so that normally no more than one of them is open at a time. A particle filter (PF1) 160 (FIG. 4) may be interposed between precursor container 102 and vacuum valve 158 to prevent particles from clogging or fouling vacuum valve 158. Particle filter 160 preferably comprises a high conductivity particle filter of the type describe below with reference to FIGS. 9–16. Alternatively, particle filter 160 may include a high efficiency particle filter.

A boost valve (V3) 164 connects a source of inert boost gas 166 to staging volume 114 at a location downstream from isolation valve 146. The diffusion barrier 130 includes a control valve (V5) 168 and a network of flow channels with flow restrictors R1, R2, and R3. Diffusion barrier 130 includes an input channel 174 from a purge gas source 176 supplying an inert gas, and an output channel 178 to a diffusion barrier pump 182. Purge gas source 176 and diffusion barrier pump 182 may be shared or combined with the source of boost gas 166 and the vacuum pump 152, respectively.

Figure 6:
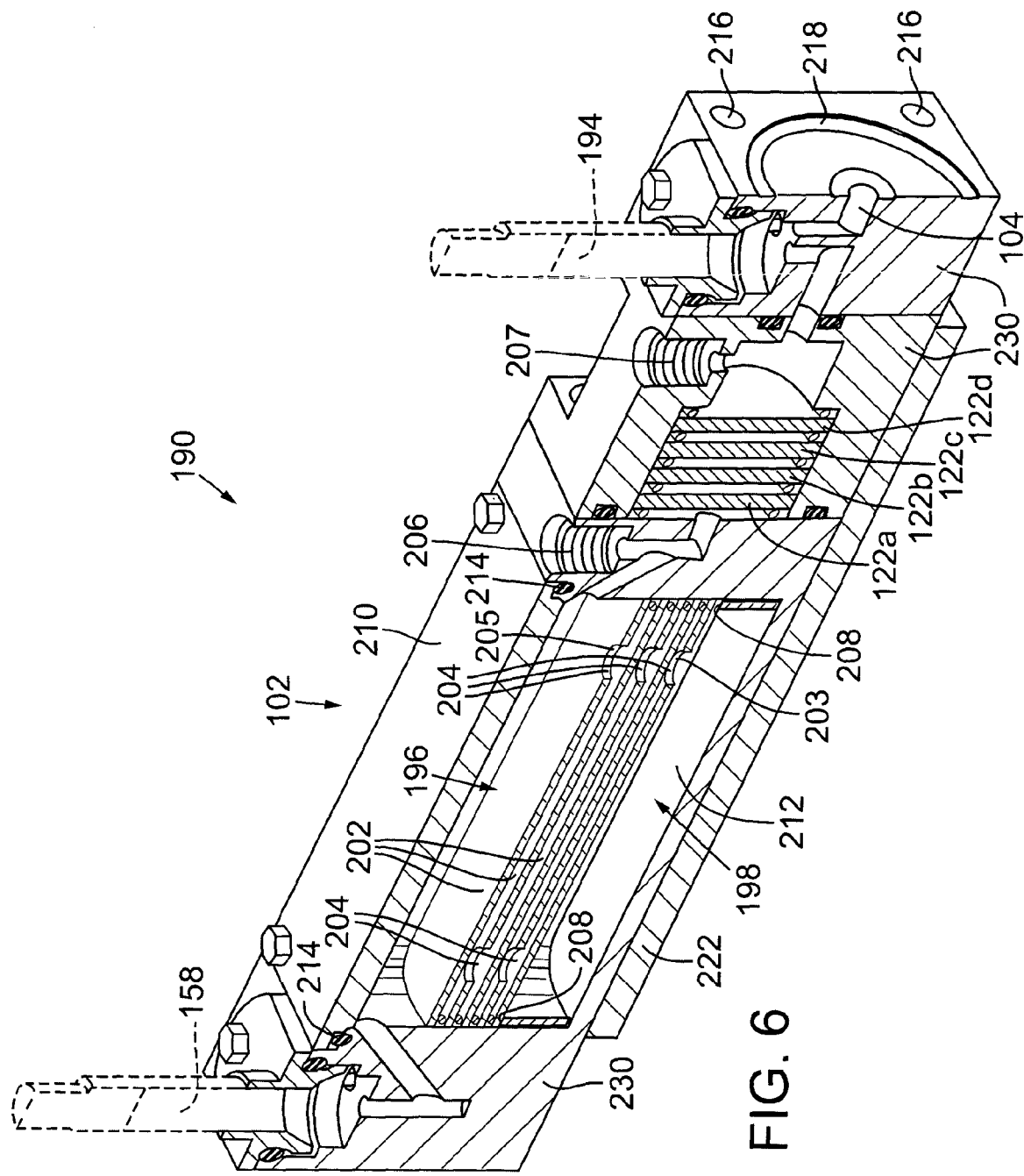
FIG. 6 is an enlarged isometric section view of a removable precursor container module for use with the precursor delivery system of FIG. 5, including detail of an optional high conductivity particle filter positioned within the precursor container of the precursor container module.

FIG. 6 is an enlarged sectional perspective view of a removable precursor container module 190 of the system 100 of FIG. 5, including precursor container 102, vacuum valve 158, and particle filter module 120. A valve 194 (not shown in FIGS. 4 and 5) is included at the end of module 190 opposite from vacuum valve 158 to allow precursor container 102 to be sealed before it is disconnected from precursor delivery system 100, to thereby prevent leakage of precursor material into the workspace when changing precursor container module 190. When precursor container module 190 is removed, isolation valve 146 (FIGS. 4 and 5) is shut to prevent leakage of precursor from staging volume 114 or loss of pressure in reaction chamber 110.

A high conductivity particle filter 196 (not shown in FIGS. 4 and 5) is optionally disposed within precursor chamber 102 above a reservoir 198 where a supply of precursor material is held (not shown). Filter 196 may take the place of or be in addition to particle filter 160 (FIG. 4). Also, if high conductivity particle filter 196 is used, then first filter 122a of particle filter module 120 may optionally be a high efficiency filter or may be omitted. In yet another embodiment (not shown), filter module 120 may be entirely replaced by high conductivity particle filter 196.

Filter 196 includes a series of stacked plates 202 and non-aligned apertures 204 creating a labyrinth filter passage within the precursor container 102 that passes by a series of inertial traps for filtering particles without significantly impeding the flow of precursor vapor. The filter passage extends between an inlet 203 communicating with flow path 104 at an upstream part of filter 196, and an outlet 205 communicating with flow path 104 at a downstream part of filter 196. (In the embodiment of FIG. 6, the flow path 104 begins at the reservoir 198 and follows the labyrinth filter passage through the filter 196 to outlet 205 and beyond.) Spacer pins (not shown, see FIG. 13) hold plates 202 in spaced relation and keep plates 202 held together as a unit that is easily replaceable and removable. The entire unit preferably rests on a lip 208 circumscribing precursor container 102, but could also hang from a removable lid 210 of precursor container 102 or stand on legs (not shown) extending to the bottom 212 of precursor container 102. Plates 202 may be closely fit to the walls of precursor container 102, thereby eliminating the need for a resilient seal or bushing therebetween. By preventing the transmission of particles, filter 196 protects high efficiency particle filters 122a–d from clogging and increases their life. A high conductivity filter design similar to filter 196 is described below in greater detail with reference to FIGS. 13A, 13B, 13C, and 13D. Various other embodiments of high conductivity particle filters useful in precursor container module 190 are described below with reference to FIGS. 9–16.

A pair of monitoring ports 206 and 207 are optionally provided for facilitating fluid measurements immediately upstream and immediately downstream of particle filter 120. Optional pressure sensors may be inserted in ports 206 and 207 for measuring a pressure drop across particle filter 120 to determine conductance of the filter and to provide a signal or alarm when particle filter 120 is clogged and requires cleaning or replacement. Pressure sensors may be coupled to controller 250 (FIG. 4) for monitoring and control purposes. Alternatively, ports may be plugged if not used.

Precursor Loading and Stabilization

A precursor such as $ZrCl_4$ is loaded into the precursor container 102 under possibly inert conditions such as a nitrogen-filled glove box. Lid 210 is sealed with an o-ring 214 and valves 158, 194 are leak tight. Precursor container module 190 is connected to downstream components of precursor delivery system 100 via bolts extending through mounting holes 216 and flow path 104 is sealed by an o-ring fitted in an annular groove 218 at the connecting end of precursor container module 190. The pressure in precursor container 102 is reduced by opening vacuum valve 158 to the bypass path 156 (vacuum path). The precursor material is also heated to operating temperature by a heater 222 positioned adjacent precursor container module 190, which can lead to an increase in pressure within precursor container 102 due to the expulsion of crystalline or adsorbed water and reaction by products with the precursor material. Pressure buildup in precursor container 102 may be periodically released by again opening vacuum valve 158. Once the precursor material has reached operating temperature, the precursor source is stabilized and ready for use. A thermocouple (not shown) may be used to monitor the temperature of the precursor material and a pressure transducer (not shown) may be used to monitor the pressure in precursor container 102, for closed loop control of heater 222 and vacuum valve 158, via an automatic controller 250 (FIG. 4).

The various components of the precursor delivery system 100 are preferably formed in or supported on one or more thermally conductive blocks 230 or other solid bodies, preferably made of a heat-resistant thermally conductive material, such as aluminum, stainless steel, titanium, or another suitable metal. Precursor delivery system 100 may be made modular through the use of more than one block 230 removably joined and sealed, thereby facilitating equipment modifications, repair, and replacement. Blocks 230 together form an elongate thermally conductive body extending from the precursor container 102 to the reaction chamber 110. In an alternative embodiment, precursor delivery system 100 may be formed in a single block of solid thermally conductive material, to eliminate the possibility of leakage at seams between the blocks 230 of FIG. 4. Because blocks 230 are formed of a solid block of thermally conductive material, they provide thermal pathway around flow path 104 having low thermal resistance, which allows a positive temperature gradient to be maintained along the flow path 104 (increases toward the reaction space) via heater 222 and a second heater 234 (FIG. 5). A positive temperature gradient ensures that precursor vapor flowing through flow path 104 will not encounter cold spots downstream from precursor container 102 and condense in flow path 104. In particular, heaters 222 and 234 ensure that the temperature of staging volume 114 is maintained at a higher temperature than precursor container 102, so that precursor material will not condense when released from precursor container 102 into staging volume 114.

Operation and ALD Processing

Figure 7:
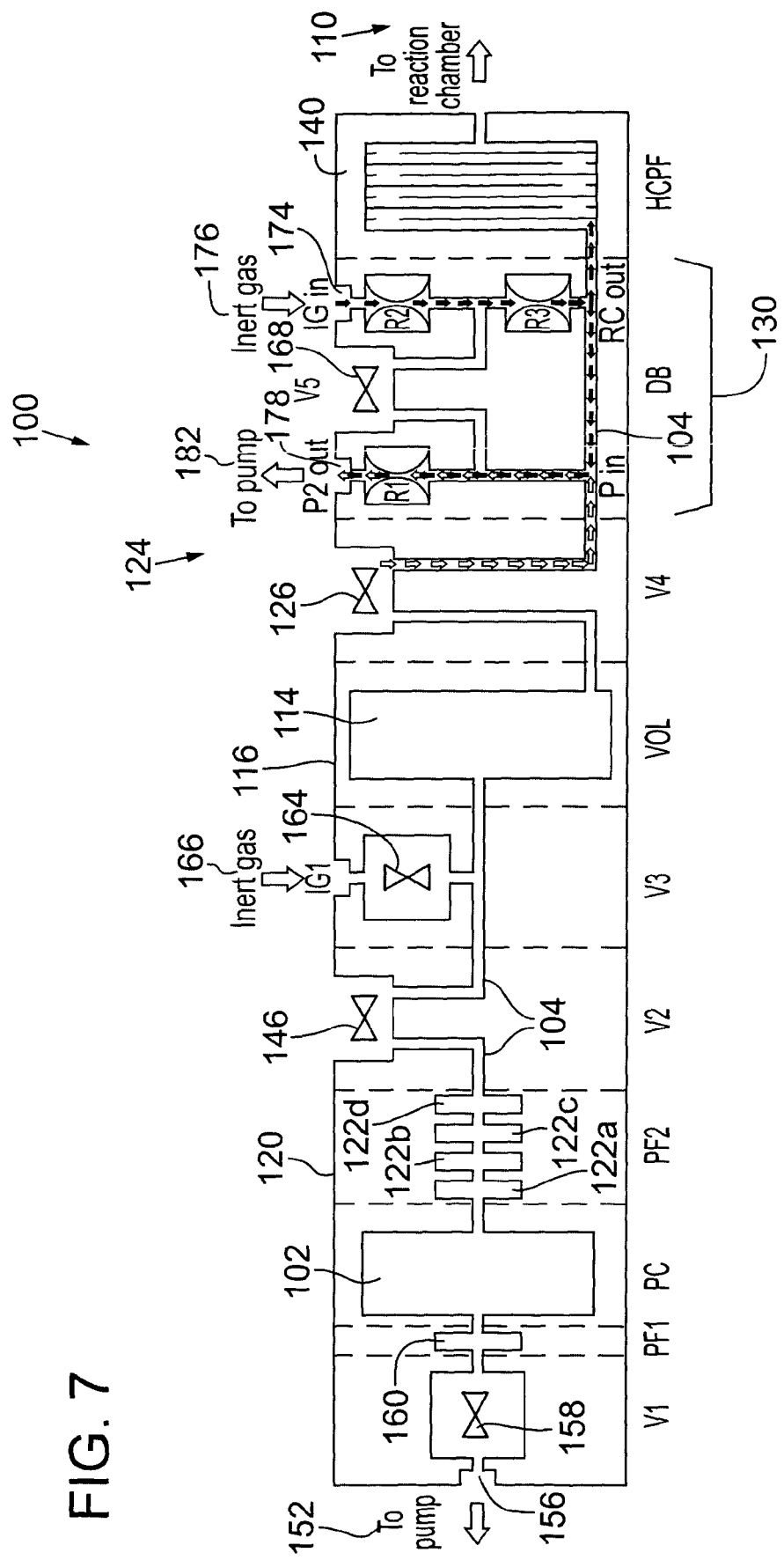
FIG. 7 is a schematic representation of the precursor delivery system of FIGS. 4 and 5, illustrating a flow of purge gas controlled by a diffusion barrier module of the precursor delivery system during a purging step of an ALD process cycle.
Figure 8:
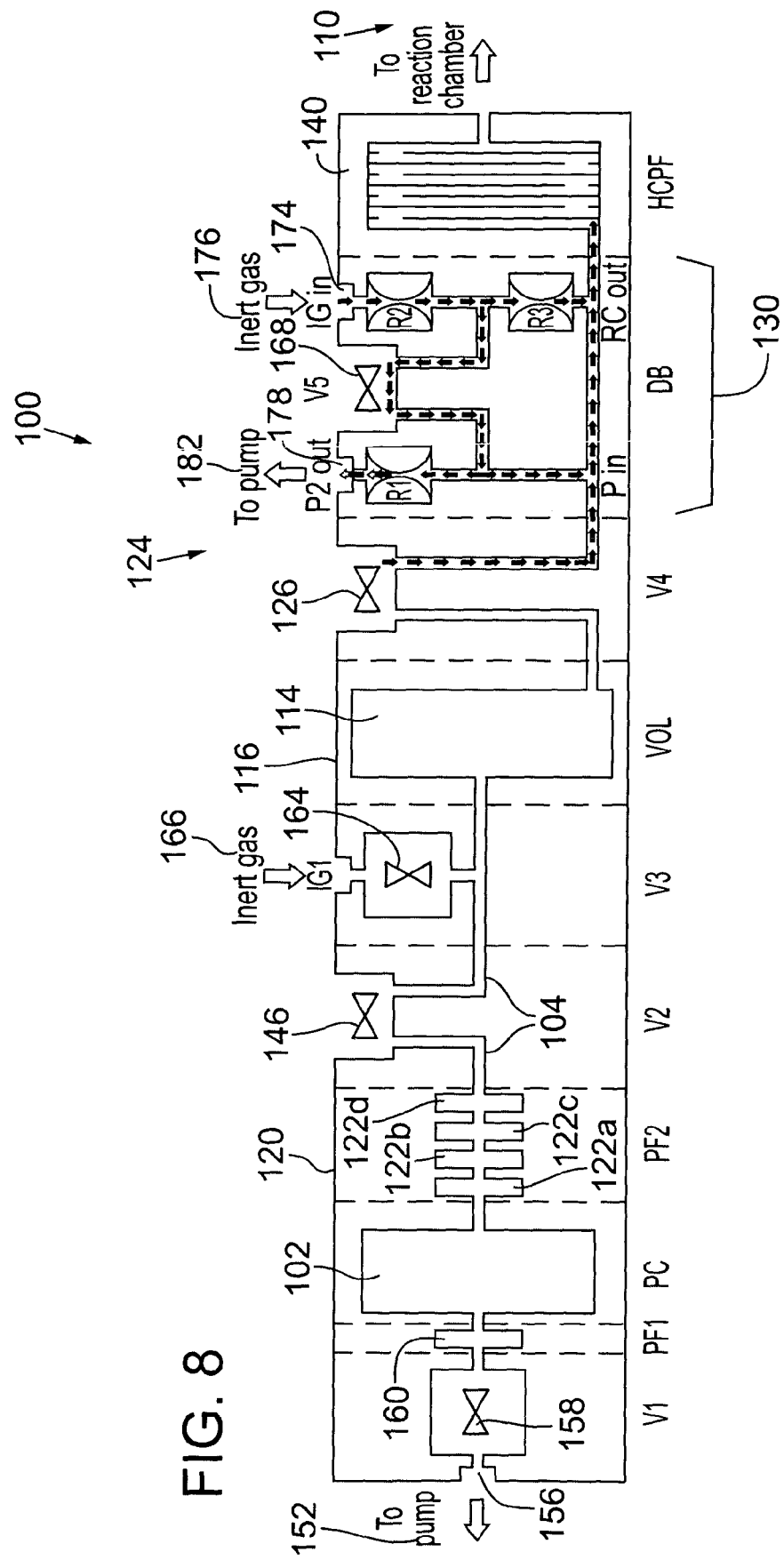
FIG. 8 is a schematic representation of the precursor delivery system of FIGS. 4 and 5, illustrating the flow of precursor vapors and purge gas during a precursor pulse step of the ALD process cycle.

Referring to the schematic of FIG. 4, the following is a preferred sequence of steps for sending pulses of precursor vapor to the reaction chamber 110:

1) Isolation valve 146 is opened to allow precursor vapor to flow into the staging volume 114 for filling of staging volume 114.
2) A control circuit 250 monitors the pressure in staging volume 114 via a pressure sensor 238.
3) When the pressure reaches a preset level, the control circuit 250 signals the isolation valve 146 to close.
4) The control circuit 250 then signals the inert gas boost valve 164 to open.
5) A control circuit 250 monitors the pressure in staging volume 114 via the pressure sensor 238.
6) When the pressure reaches a preset operating level, the control circuit 250 signals the inert gas boost valve 164 to close.
7) The diffusion barrier control valve 168 is opened to change the direction of the diffusion barrier flow as shown in FIG. 8.
8) The precursor pulse valve 126 is opened, which allows a pulse of the precursor vapor to flow from staging volume 114 towards reaction chamber 110.
9) The precursor vapor travels through high conductivity particle filter (HCPF) 140 where it must make several high speed changes of direction. This action separates any remaining particles from the precursor vapor due to the higher inertia of the particles.
10) The precursor vapor enters the reaction chamber 110 where a single monolayer chemisorbs on the surface of the substrate.
11) Pulse valve 126 is then closed and the concentration precursor material present in reaction chamber 110 decays through the action of inert purge gas supplied by diffusion barrier 130 (i.e., the reaction chamber is purged of the precursor material). Diffusion barrier control valve 168 is closed to change the direction of the diffusion barrier flow as shown in FIG. 7, to prevent any precursor material leaking through pulse valve 126 from reaching reaction chamber 110.
12) After a suitable purge time has elapsed, a pulse of second precursor material is released into reaction chamber 110 via a second precursor delivery system (not shown) acting in a similar manner as described above.
13) The pulsing sequence of the two (or more) precursors is repeated until the desired thickness of the film is reached.

At the end of the process the integrity of the seals in valves 126, 146, and 164 may be checked by filling staging volume 114 to a predetermined pressure and using pressure sensor 238 to check for a pressure change in staging volume 114 over time. If the pressure decreases then it is assumed that pulse valve 126 is leaking; if the pressure increases it is assumed that either boost valve 164 or isolation valve 146 is leaking. Either situation suggests maintenance is needed.

The level of the precursor may be checked by filling staging volume 114 to a predetermined pressure with inert gas (via boost valve 164), then opening isolation valve 145. The pressure measured by pressure sensor 238 will decrease as the inert gas expands into the precursor container in the open space above the supply of precursor material. The ideal gas equation $PV=nRT$ can be used to calculate the volume additional volume filled by the expanding gas, which represents the open space above the supply of precursor material in the bottom of precursor container 102. The volume can then be compared to baseline information on the known volume of an empty precursor container 102, to determine the amount of precursor material remaining in precursor container 102.

Turning again to FIG. 4, the precursor material is loaded into precursor container 102 at a pressure of about 1 bar. Many precursors cause a large pressure increase in the container upon first heating, which can lead to large amounts of particles in the reaction chamber 110 if the pressure increase is released via the flow path 104 toward the reaction chamber 110. To eliminate this source of particles, vacuum valve 158 and vacuum path (bypass path) 156 allows excess pressure and agitated particles to be directed to pumps 152 away from reaction chamber 110. To prevent vacuum valve 158 from becoming plugged, a particle filter 160 may be provided. Particle filter 160 inhibits particles from powdered precursors (and droplets, in the case of liquid precursors) from being carried into staging volume 114. Particle filter 160 may include a high efficiency particle filter having low flow conductivity, or a high conductivity particle filter 196 (FIG. 6), or a combination of both kinds of filters. Because filter 160 is not located between pulse valve 126 and reaction chamber 110, a high flow resistance of filter 160 will not increase the rise or decay time of precursor pulses. If filter 160 has a high resistance (low conductivity), it can also act as a flow dampener to reduce turbulence in precursor container 102 during pump down of precursor container 102 (i.e., when reducing pressure in precursor container 102 via vacuum path 156 and pumps 152). Reducing turbulence in precursor container 102 further reduces the incidence of particle transmission into flow path 104 and reaction chamber 110.

For improved process control it is advantageous to control the dose of precursor in each pulse. A control system 250 ("controller" in FIG. 4) typically includes a computer and drive electronics (for solenoid valves) or a pneumatic control system (for pneumatically driven valves) for driving the valves 126, 146, 158, 164, 168 between their open and closed states. Control system 250 coordinates the operation of the valves to direct the precursor material to the reaction chamber, as described above, and, via diffusion barrier 130, to prevent any leaked precursor from reaching the reaction chamber 110. To improve the repeatability of the dose of precursor material included in each pulse released by pulse valve 126, pressure sensor 238 may be used to provide closed-loop feedback to control system 250.

Another advantage of pressure sensor 238 is the ability to do diagnostic tests on valves periodically or before each process run, to monitor valve leakage or failure. Over time all of the valves that come in contact with the precursor vapors will begin to leak, which can lead to non-uniform films and non-ALD growth. By setting the pressure of staging volume 114 to a certain level and determining the rate of change of the pressure it is possible to determine if a valve is leaking significantly. It is also possible to determine if the precursor supply has been exhausted, as described above.

It is possible to increase the pressure of staging volume 114 before each pulse, by injecting $N_2$ or another inert gas via boost valve 164. Pressure increase provided by an inert gas boost enhances the injection of precursor material vapor into the reaction chamber 110, which is especially important for low vapor pressure precursors. Alternatively, an inert gas boost can increase the pressure in staging volume 114 before the precursor vapor is released into it from precursor container 102, so that the pressure difference between the precursor container 102 and the staging volume 114 is reduced. A reduced pressure differential between precursor container 102 and staging volume 114 during filling of staging volume 114 helps prevent turbulence upon opening of isolation valve 146, which can otherwise cause particles to be stirred and transmitted into staging volume 114, especially when using high vapor pressure powder precursors.

Pulse valve 126 allows precursor vapor to travel from staging volume 114 toward reaction chamber 110. Pulse valve 126 is the principal barrier preventing the precursor material from entering the reaction chamber 110 at undesired times. However, diaphragm valves of the type used for pulse valve 126 will begin to leak after a time when exposed to most precursor vapors. To prevent the leaked vapor from reaching the reaction chamber 110 and causing CVD growth, the so-called "diffusion barrier" concept is employed. In this manifestation of the "diffusion barrier" concept, any vapor leaked from pulse valve 126 will preferentially be carried towards the "P2 out" outlet channel 178 by a backflow of inert gas, as shown in FIG. 7, in which pumps 182 draw the leaked vapor away from the system 100, bypassing reaction chamber 110. As shown in FIG. 8, when a pulse of precursor vapor is released the diffusion barrier control valve 168 is opened to release a forward flow of inert gas (such as $N_2$), to prevent the precursor vapor from being drawn into pump 182 and bypassing the reaction chamber 110. The gas flows during the pulse time are illustrated in FIG. 8. The ability to switch between a backflow of inert gas in flow path 104, as shown in FIG. 7, and a forward flow of inert gas, as shown in FIG. 8, merely through opening and closing of a single control valve 168, is achieved by adjusting flow restrictors R1, R2, and R3 to properly balance the pressures at each intersection in diffusion barrier 130.

During the purge cycle (FIG. 7), pulse valve 126 is closed to stop the flow of precursor material from the staging volume 114, and any remaining precursor gases are purged by a flow of inert gas from inlet channel 174 ("IG in") though the diffusion barrier 130 (as illustrated in FIG. 7 by black arrows). The inert gas also flows through the high conductivity particle filter 140 and the reaction chamber 110 to purge residual precursor material. The backflow of inert gas is pumped through pumps 182 in diffusion barrier 130 upstream from the inlet channel 174. This backflow of inert gas carries out of the system through pump 182 any precursor chemical that may leak through the pulse valve 126 (as indicated by the white arrows).

One benefit of the diffusion barrier 130 is that the flow of inert gas tends to push the flow of the precursor material during the purge stage, reducing the delay between the time when the precursor material is released from staging volume 114 and when it enters the reaction chamber 110. An even greater boost is provided by inert gas boost module 164, 166, coupled to the flow path upstream from staging volume 114. When boost valve 164 is opened, inert gas is pumped into the staging volume 114 via inlet IG1. If staging volume 114 holds only a single dose of precursor material, boost valve 164 can be opened when pulse valve 126 is opened, to push precursor material from the staging volume 114 into the reaction chamber 110 more quickly. When the pulse valve 126 is closed, the boost valve 164 is also closed to maintain the lowered working pressure of staging volume 114. Isolation valve 146 is then opened to recharge staging volume 114 with another dose of the precursor material.

Preferably, staging volume 114 holds more than one dose of precursor material, in which case the use of an inert gas boost during pulsing may be unnecessary. Further, when the staging volume 114 holds much more than a single pulse, a smaller pressure differential need be applied between staging volume 114 and reaction chamber 110 in order to release sufficient precursor vapor for thin film deposition processing. A smaller pressure differential further reduces turbulence and the transmission of particles from staging volume 114 through flow path 104. For example, staging volume 114 should desirably hold enough precursor vapor so that upon release of a single pulse of precursor vapor (and without inert gas boost or other inflow into staging volume 114), the pressure inside staging volume 114 decreases less than 50% of its pre-pulse pressure. More preferably the pressure decreases no more than 30% of its pre-pulse pressure.

A high conductivity particle filter 140 is preferably the last element in the flow path 104 before reaction chamber 110. It is important that this filter is highly conductive, as any flow resistance will lead to a lengthening of the precursor decay. To separate particles from the precursor vapor without adding significant resistance in the flow path 104, the high conductivity particle filter 140 includes a labyrinth filter passage that requires the precursor vapor to make many fast changes of direction. The inertia of particles carried by the precursor vapor causes them to be trapped in dead ends of the labyrinth (i.e., "inertial traps") while the precursor vapor can continue to flow through the high conductivity particle filter 140. As described below with reference to FIGS. 9–16, the labyrinth and inertial traps may be formed of a variety of different structures and may have a variety of different shapes and orientations.

High Conductivity Particle Filters

Referring to FIG. 9, a cross-sectional view of one embodiment of a high conductivity particle filter 410 is shown. The filter 410 provides a primarily two-dimensional flow that captures unwanted particles. In order to separate particles from a vapor stream, the higher inertia of particles is used to separate the particles.

The filter 410 includes a filter passage (hereinafter "flow path") 412 that may be formed in a block 414. The flow path 412 is configured as a continuous spiral in communication with an input 416 and an output 418. The arrows indicate the direction of vapor flow through the flow path 412. The output 418 may be oriented perpendicular to the flow path 412. In application, the flow path 412 provides one-way directional flow of a vapor stream from the input 416 to the output 418. Configured as shown, the flow path 412 is a plane curve that moves around the fixed point of the output 418 while constantly approaching the output 418.

The flow path 412 is in communication with a plurality of tangential particle reservoirs or traps 420. As vapor travels through the flow path 412 the particles have greater inertia than the vapor. As the vapor travels through the curve, the inertia of particles does not allow the particles to follow and the particles are captured in the traps 420 while the vapor continues. Several traps 420 disposed along the flow path 412 provide a highly efficient filter 410 that does not constrain flow. The exact number of traps 420 may vary and depends, in part, on system design limitations.

The filter 410 may be formed from a block 414 of heat-resistant material, such as metal. The material may be aluminum, silicon, titanium, copper, stainless steel or other high thermal conductivity material. In manufacturing, the flow path 412 may be drilled or otherwise machined from the block 414. A lid may then be placed on the block 414 to seal the flow path 412. The filter 410 may be interchangeable in a modular system to facilitate equipment modifications, repair, and replacement. After forming the filter 410, the filter 410 (including the walls of the flow path 412) may be coated with $Al_2O_3$ or other chemically resistant material to protect the filter 410 from corrosive vapors and/or abrasive particles.

Referring to FIG. 10, another embodiment of a high conductivity particle filter 422 is shown that also relies on a primarily two-dimensional flow path 424. The filter 422 may be formed in a manner similar to the previous embodiment. The flow path 424 is in communication with an input 426 and an output 428. The flow path 424 is configured as a spiral, but not a curved spiral as in FIG. 9. As defined herein, the term spiral refers to a path that moves around and approaches a fixed point, such as an output. Thus, the spiral need not be continuously curving, but does move around and approaches a fixed point.

The movement around the fixed point may be achieved through angled turns 430. The angled turns 430 of FIG. 10 are approximately 45 degrees relative to the flow path 424. Of course, turns having other angles may also be used. The flow path 424 includes two angled turns 430 in order to negotiate a 90-degree turn in the block 414. One of skill in the art will appreciate that the configuration of the spiral flow path 424 may vary and the embodiments shown herein are for exemplary purposes only. For example, the block 414 may not have a rectangular cross section in which case, the flow path 424 may be adjusted accordingly. As such, the angles and the number of turns may be varied as required.

A trap 432 is disposed before an angled turn 430 such that the trap 432 continues along the direction of the flow path 424 before the angled turn 430. As the vapor stream approaches the turn, the inertia of the particles is greater than that of the vapor. As the vapor stream passes through an angled turn 430, particles continue along the former path of the flow path 424 and into a trap 432. The filter 422 includes several traps 432 to provide high filtering efficiency. The traps 432 do not limit the flow of a vapor stream, which allows for high conductivity.

The turns need not all have the same angle in order to accommodate the flow path. For example, in the embodiment shown in FIG. 10, two 90-degree angles are used for the first and last turns 434 in the flow path 424. Based on design considerations, the angles of the turns 430, 434 may vary. Furthermore, not every turn 430, 434 needs to have a corresponding trap 432. Nevertheless, in order to maximize efficiency it is desirable to include a greater number of traps.

Referring to FIG. 11, a cross-sectional view of another embodiment of a high conductivity particle filter 436 is shown. As in the foregoing embodiments, the filter 436 may be formed from a block 414 with a flow path 438 machined within. The flow path 438 is similar to the embodiments of FIGS. 9 and 10 in that it spirals around and approaches an output 440. The flow path 438 is also in communication with an input 442 for introducing a vapor stream into the filter 436.

The spiral flow path 438 is comprised entirely of 90-degree angled turns 444. In alternative implementations, the angle of the turns 444 may vary. A trap 446 is disposed prior to an angled turn 444 such that the trap 446 continues along the direction of the flow path 438 before the angled turn 444. As the vapor stream passes through an angled turn 444, particles continue along the former path of the flow path 438 and into a trap 446. Traps 446 may be placed prior to each turn 444 to maximize the efficiency of the filter 436.

The flow paths shown in FIGS. 9–11 may be altered into various configurations and still provide a spiral that approaches a central point. A flow path may include a combination of features heretofore described. For example, a flow path may include 45-degree angled turns, 90-degree angle turns and turns of other angles. A flow path may also include a combination of curves and angled turns. In an alternative embodiment, the input and the output may be reversed such that the flow path originates at a center point and moves around the center point as it approaches the output. In such an embodiment, the traps are disposed in an alternative configuration to capture particles. Thus, high conductivity particle filters are not necessarily limited to the embodiments shown, which are for exemplary purposes only.

Referring to FIG. 12, a cross-sectional view of another embodiment of a high conductivity particle filter 450 is shown. The filter 450 may be formed from a block of heat resistant material as in previous embodiments. The filter 450 includes a housing 451 that surrounds elements of the filter 450, such as a flow path 452. The flow path 452 is in communication with an input 454 and an output 456 and includes a series of 180-degree turns 457 to separate particles from a vapor stream.

The filter 450 includes a series of baffles aligned to define paths and traps. The filter 450 includes a major baffle 460 that defines a path 462 for a vapor stream. The housing 451 provides an opposing side and also defines the path 462. A minor baffle 464, that is substantially in the same plane as a corresponding major baffle 460, defines a trap 458 to capture particles. The housing 451 also defines the trap 458. The trap 458 continues in the same direction as the path 462. The turns 457 require abrupt directional changes and particle inertia will cause particles to enter traps. As in previous filters, the trap 458 is a dead end to capture and retain particles. As the names indicate, the major baffle 460 has a greater length than the minor baffle 464. Accordingly, the path 462 is longer than a corresponding trap 458.

An aperture 466 separates the major and minor baffles and is nonaligned with a subsequent adjacent aperture. The aperture 466 may also be nonaligned with the input 454 and output 456. The aperture 466 provides the only exit for a vapor stream from the path 462 to a subsequent path. The aperture 466 may be referred to as providing the only flow path exit from the path 462. The flow path is defined as passing from the input 454 to the output 456 in the direction indicated by the arrows. Thus, the vapor stream must pass through the aperture 466 and be subject to a 180-degree angled turn 457.

As the vapor stream enters the filter 450, the vapor stream enters the path 462. The input 454 may be disposed perpendicular to the major baffle 460. The vapor stream continues along the path 462, toward the trap 458, until encountering the aperture 466. Since the vapor has less inertia than the particles, the path of the vapor will tend to bend and travel through the aperture 466. The particles, due to their greater inertia, will tend to continue on their direction and enter the trap 458.

A second major baffle 470 is disposed parallel to the first minor baffle 464, and together the first minor baffle 464 and the second major baffle 470 defines a pocket 472 that serves as a secondary trap to capture particles ejected from the flow path 462 after the flow path has passed through the aperture 466.

A vapor stream passing through the aperture 466 enters a second path 468 that is defined by the second major baffle 470 and the first major baffle 460. The second major baffle 470 is disposed to create a 180-degree turn 457 for the vapor stream. The second major baffle 470 is separated from a second minor baffle 474 by a second aperture 476. The second minor baffle 474 is substantially in the same plane as the second major baffle 470 and defines a second trap 478. The second trap 478 continues in the same direction as the second path 468 to capture particles. The second major baffle 470 is longer than the second minor baffle 474 as the second path 468 is longer than the second trap 478.

The second aperture 476 provides the only exit for a vapor stream passing from the first path 462 to the second path 468. The second aperture 476 is nonaligned with the aperture 466 or a subsequent downstream aperture.

Additional major and minor baffles with separating apertures may be similarly disposed to create a series of 180-degree turns 457 and corresponding traps. Some particles, especially smaller particles, may be able to follow the vapor through one or more apertures without being captured in a trap. Further, while the traps are designed to retain particles, it remains possible for particles collected in a trap to be drawn back into the vapor stream. Accordingly, multiple stages of filtering are used to increase the overall effectiveness of the filter 450.

To increase the chances that a particle will be captured, the velocity of the stream should be as high as possible at the turn 457. The inertia differences that separate particles from the vapor are a function of the velocity of the flow and, in particular, the velocity of the particles. Accordingly, the path leading up to a trap should be as long as space allows, which will allow sufficient room in which to accelerate the particles to a substantial linear velocity before reaching the turn adjacent the trap.

The output 456 may be disposed perpendicular to a final major baffle 477 and is in communication with a final path 479. The number of baffles and turns may vary based on design considerations, but allows for high conductivity while maintaining the efficiency of the filter 450.

The surface of each trap 458, 478 and pocket 472 may be modified to help retain particles in the traps and pockets. For example, one or more of the trap and pocket surfaces may be roughened or have an adhesive coating applied, to cause particles to adhere to the surfaces. The entire flow path may include a rough surface or an adhesive coating as well. In this implementation, particles traveling through the flow path would be collected and retained by the flow path surface.

Referring to FIG. 13A, a plan view of a plate 480 for use in another embodiment of a high conductivity particle filter is shown. The plate 480 may be formed of a heat resistant material and in any number of shapes including a circle, oval, ellipse, rectangle and the like. The plate 480 includes an aperture 482 that provides an exit for a vapor stream passing through a filter. The aperture 482 may be aligned off-center so as to be nonaligned with a filter input and output. The aperture 482 is not disposed on the perimeter or edge of the plate 480, rather the aperture 482 is disposed at an intermediate location on the surface area of the plate 480. As such, the surface area of the plate 480 surrounds the aperture 482, and the aperture does not contact a perimeter of the plate 480. The plate 480 serves as a retaining wall to capture and retain particles.

Referring to FIG. 13B, a plan view of a second plate 484 is shown for use in series with the plate 480 of FIG. 13A. The second plate 484 may be formed of a similar shape and size as the first plate 480. The second plate 484 also includes a second aperture 486 that provides an exit for vapor stream passing through a filter. As with the first plate 480, the aperture 486 is disposed at an intermediate location on the surface area of the plate 480. The second plate 484 may, in fact, be identical to the first plate 480. However, when disposed adjacent to the first plate 480, the second plate 484 may be rotated 180 degrees such that the second aperture 486 is nonaligned with the first aperture 482.

Referring to FIG. 13C, a perspective view of a series of plates 480, 484 is shown. The plates 480, 484 are aligned as they may be disposed in a high conductivity particle filter. The number of plates 480, 484 may vary based on design considerations and desired filtering efficiency. Each plate 480, 484 is spaced apart from one another to form a chamber therebetween. The plates 480, 484 are disposed such that the apertures 482, 486 are nonaligned with sequential apertures. For good conductivity, the spacing between the plates is preferably the same as the average diameter of the aperture, which is preferably the same as the average diameter of the input and output.

Referring to FIG. 13D, a cross-sectional view of a high conductivity particle filter 488 is shown which includes plates 480, 484 within a housing 490. The housing 490 couples to each plate 480, 484 and fixes the plates 480, 484 in spaced-apart relation. The housing 490 may be cylindrical or other shape, and has sealed first and second ends 492, 494 to define an interior 496. The housing 490 and the plates 480, 484 define multiple sequential chambers 498 within the interior 496. The housing 490 is secured to each plate 480, 484 so that the corresponding aperture 482, 486 provides the only exit from one chamber 498 to an adjacent chamber.

An input 500 provides passage through the first end 492 and is in communication with a first chamber 502. Similarly, an output 504 provides passage through the second end 494 and is in communication with a final chamber 506. The input 500 and output 504 may be disposed perpendicular to the surface area of the plates 482, 484. The input 500 and output 504 may be nonaligned with the sequential apertures 482, 486.

The filter 488 may be characterized as providing a three-dimensional flow path, as vapor movement is not primarily confined to two dimensions. A vapor stream must pass through the provided aperture to exit each chamber and undergoes a series of turns. Sequential apertures 482, 486 are preferably distanced from each other as much as possible to lengthen the flow path and increase the velocity of the vapor stream. As the vapor stream passes through the apertures 482, 486, the particles, having a greater inertia, will continue along their former path and collect in traps of the chambers 498 adjacent the apertures. A series of plates 480; 484 and chambers 498 provide a highly efficient filter without unnecessary flow resistance. The interior surfaces of the chambers 498 may be modified to encourage particle adhesion. For example, the interior surfaces of a chamber 498 may be roughened or coated with an adhesive to retain particles.

In one embodiment (not shown), the plates 480, 484 may be spaced progressively closer to one another along a flow path to sequentially decrease the volumes of the chambers. Accordingly, the first chamber 502 would have a greater volume than the second chamber 508, the subsequent chamber would have a volume less than the second chamber 508, and so forth. The final chamber 506 may be configured with the smallest volume of all the previous chambers. Progressively decreasing the chamber volumes gradually decreases the cross-section of the flow path through the filter 488 and increases the velocity of a vapor stream. An increased vapor stream velocity increases the likelihood of smaller particles being retained in a trap 498. Apertures 482, 486 may also have sequentially decreasing diameters to decrease the cross-section of the flow path.

Referring to FIG. 14, a cross-section of another embodiment of a high conductivity particle filter 510 is shown. The particle filter 510 includes a housing 512 with sealed first and second ends 514, 516, which define an interior 518. The filter 510 includes an input 520 and an output 521, which allows passage through the first and second ends 514, 516 respectively.

The filter 510 includes tubes 522 that are disposed parallel to one another. Each tube 522 has sealed first and second ends 524, 526 and a first (input) aperture 528 and a second (output) aperture 530 disposed along the length of the tube 522. The apertures 528, 530 allow for a flow path 536 through the tube 522 and define first and second traps 532, 534 within each tube 522. The traps 532, 534 extend from corresponding apertures 528, 530 to the respective second and first sealed ends 526 and 524. As such, each trap 532, 534 is a "dead end" in which particles are captured and retained in a manner similar to previously described embodiments.

Each tube 522 includes a path 537 which may be generally defined as the length of the tube 522 from the first aperture 528 to the second aperture 530. Vapor exiting the path 537 must turn through the output aperture 530 and particles, having a higher inertia than the vapor, continue in the same direction and enter a trap 534.

The tubes 522 are in communication with one another to provide a sinuous flow path that includes a series of paths 537 and turns. Traps 532, 534 are disposed adjacent each aperture 528, 530 to capture particles unable to negotiate a turn. The number of tubes 522 used for a flow path may vary based on system design constraints and desired efficiency of the filter 510.

The first and second apertures 528, 530 provide communication between the tubes 522 in the filter 510 as shown in FIG. 14. Thus, whether an aperture may be characterized as an input or output is relative to the tube since an output for one tube is an input for an adjacent tube.

The last tube in the flow path is defined herein as the output tube 538 and is in communication with or passes through the output 521. The output tube 538 may have an open end 540 to provide an exit for the vapor stream as shown in FIG. 14. Alternatively, the output tube 538 may have one or more output apertures.

In the embodiment shown in FIG. 14, the filter 510 provides split paths 536a and 536b. After passing through the input 520 into the interior 518, the vapor stream is bifurcated into the two flow paths 536a and 536b. Each flow path passes through a series of parallel tubes 522 configured with paths 537 and apertures 528, 530. The flow paths 536a and 536b merge when reaching the output tube 538 before exiting the filter 510. One of skill in the art will appreciate that the tubes 522 may be arranged in series to provide a single flow path, or two or more flow paths.

The filter 510 may further include one or more preliminary traps 542 adjacent the input 520. The preliminary traps 542 may be formed by the extending the walls of the tubes 522 beyond their sealed first ends 524. The preliminary traps 542 may be disposed such that incoming vapor stream must turn and pass over the traps 542 before entering into the tubes 522. As in previous embodiments, the preliminary traps 542 and the previously discussed first and second traps 532, 534 may have their interior surface roughened or coated with an adhesive to retain particles. The entire interior surface of the tubes 522 and the output tube 538 may include a rough surface or an adhesive coating to capture and retain particles.

A method of increasing velocity is to decrease the cross section of paths 537. Thus, the tubes 522 may be configured with progressively decreasing cross sectional areas in the direction of a flow path. Decreasing the cross sectional area of a flow path increases the velocity of a fluid as it travels along the flow path.

Figure 15:
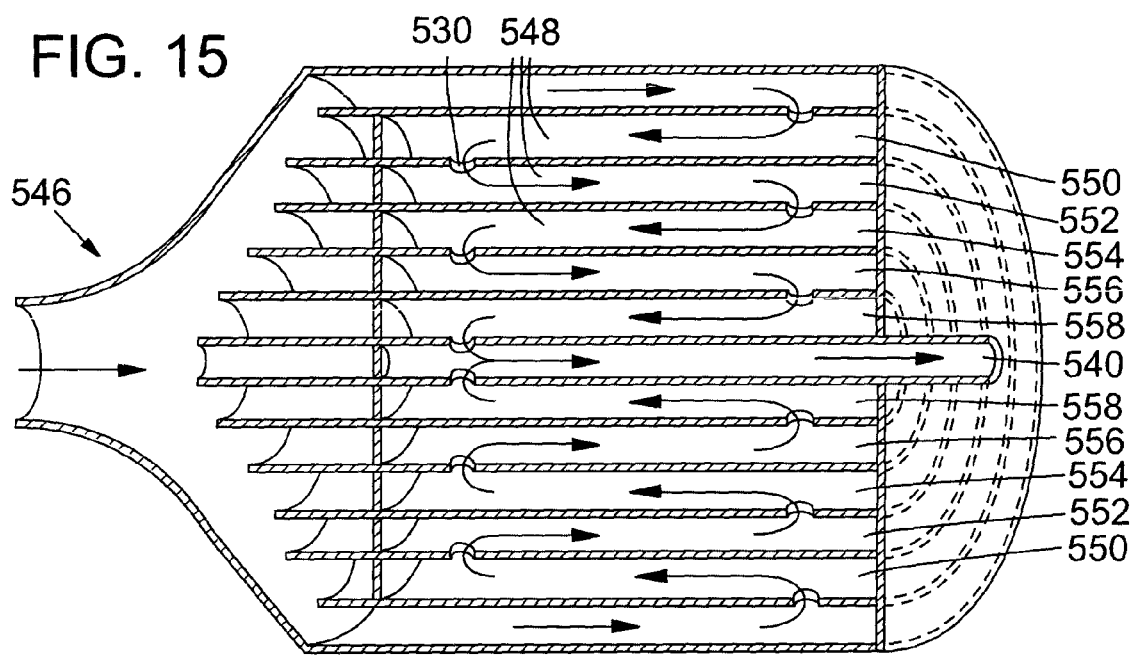

FIG. 15 is a perspective cross-section view of an alternative embodiment of a high conductivity particle filter 546 similar to the filter 510 of FIG. 14. With reference to FIG. 15, the filter 546 is formed of concentric tubes 548 having progressively smaller diameters as the flow path traverses from a first tube 550 to subsequent tubes 552, 554, 556, and 558. The decreasing diameters of the tubes 550, 552, 554, 556, and 558 form progressively smaller cross-sectional flow areas as the flow path (or paths) proceeds to the output tube 538. Apertures 530 may also be configured with incrementally decreasing diameters along a defined flow path.

The vapor stream proceeds from tube 550 to 552 to 554 to 556 to 558 and, since the cross section is decreasing, the vapor stream velocity is increasing, thereby increasing the inertia of any particles in the vapor. The decreasing diameters and increasing particle inertia encourage separation of the increasingly smaller particles from the vapor stream as the flow proceeds to the outlet 540.

Figure 16:
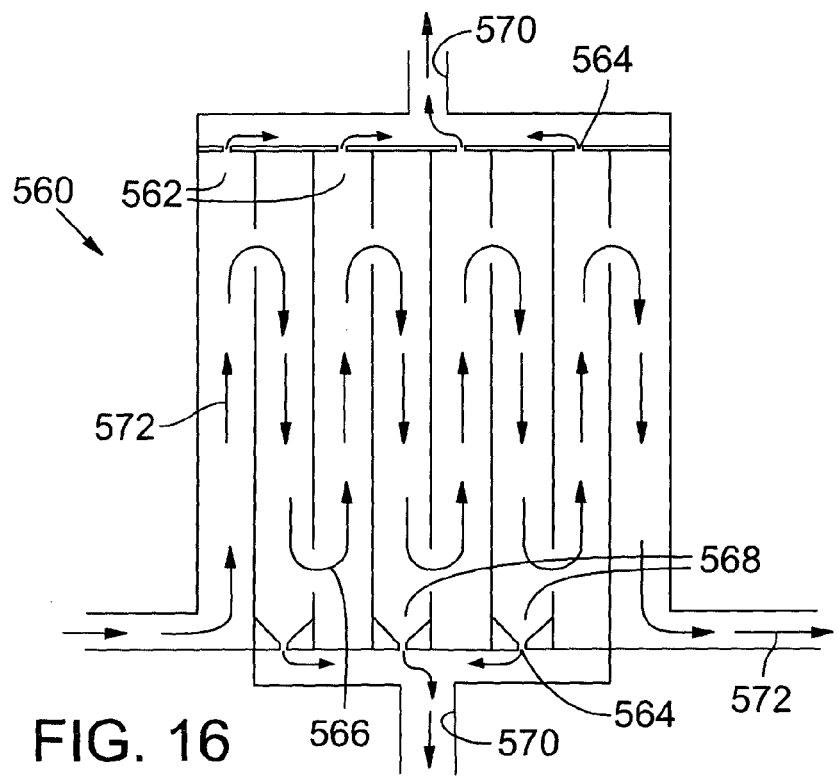

Referring to FIG. 16 another alternative embodiment of a filter 560 having high conductivity is shown. The traps 562 include an orifice 564 that is in communication with a pump or a bypass line (not shown). An orifice 564 may be effectively implemented with traps of previously discussed embodiments.

An orifice 564 may have a cross-section that is approximately 1 to 5 percent as large as the cross-sectional area of the vapor flow channel 566. The orifices 564 communicating with a pump improve the ability of the filter 560 to capture and retain particles from a vapor stream 572. The orifices 564 also provide a means for cleaning the traps in-situ, without disassembling the filter 560, to thereby prevent the traps from becoming filled with particles that might otherwise be drawn back into the vapor stream 572. The resistance of the orifices 564 should be high enough so that the majority (e.g., preferably more than 90 percent) of the vapor stream 572 flowing through the filter 560 does not go through an orifice 564, but rather continues to the exit of the filter 560.

To direct the particles toward an orifice 564, a trap 568 may have sidewalls that are tapered toward the orifice 564 in a funnel configuration. In this implementation, particles traveling through the orifice 564 are directed away from the trap 568 down a separate path 570. The particles are permanently removed from the vapor stream 572. Some traps 568 may have tapering configurations while other traps 562 do not. Furthermore, some traps 562 may have orifices 564 while others do not.

The high conductivity particle filters described herein provide a flow path with turns and traps to capture particles. The number of turns and traps ensure filter efficiency. The turns preferably involve abrupt high-speed changes of direction, which separates particles from vapor due to higher inertia. The filter's high conductivity offers little flow resistance, thereby speeding up precursor vapor pulse decay. Faster switching times for precursor vapor are possible due to the decreased resistance. Although the filter is described for use in a precursor vapor delivery system, the filter may also be used in a pumping line, a reaction chamber, and other applications.

Depending upon the location of the filter, the preferred dimensions and operating conditions will vary. When the filter is in a precursor delivery system of an ALD system or other thin film deposition system, it may typically operate at a temperature in the range of 120° C. to 250° C. and at a pressure in the range of 1 to 10 Torr with flows less than 1 standard liter per minute (slm). If the filter is located near a reaction chamber, it may typically operate at a temperature in the range of 200° C. to 500° C. and at a pressure of 0.5 to 5 Torr at flows in the range of 1 to 10 slm. If the filter is located in the pumping line, it may operate near room temperature at pressures in the range of 0.1 to 10 Torr and at flows in the range of 1 to 10 slm.

Passivation

In all of the embodiments of the precursor delivery system 100 shown herein, the interior surfaces of the flow path 104 (including valves and high conductivity particle filters) exposed to the vapor stream are preferably coated or passivated to prevent chemical reactions. Otherwise, the precursor vapor stream may react with the surface of the material of which the filter is made. Reactions affect the concentration of a vapor stream and destabilize precursor delivery system 100. The coating or passivation may include, for example, oxides such as $Al_2O_3$, $ZrO_2$, $HfO_2$, $TiO_2$, $Ta_2O_5$, and $Nb_2O_5$; nitrides such as AlN, ZrN, HfN, TiN, TaN, and NbN; or carbides such as AlC, ZrC, HfC, TiC, TaC, and NbC; and mixtures thereof.

Uses

Precursor material delivery systems 100 in accordance with the embodiments described herein are preferred for precursors that are solids at temperatures they are vaporized. Examples of such precursors include metal halides, metal β-diketonates, and organometal compounds. In particular, such systems are preferred for hafnium tetrachloride ($HfCl_4$), zirconium tetrachloride ($ZrCl_4$), aluminum trichloride ($AlCl_3$), tantalum pentachloride ($TaCl_5$), niobium pentachloride ($NbCl_5$), molybdenum pentachloride ($MoCl_5$), tungsten hexachloride ($WCl_6$), platinum (II) acetylacetonate ($Pt(acac)_2$), and tris(cyclopentadienyl)scandium ($Sc(Cp)_3$), among others. As noted above, precursor material delivery systems in accordance with the preferred embodiments may be adapted for use in various types of thin film deposition systems, including ALD systems, CVD systems, MOCVD systems, PVD systems and others, especially when it is desirable or necessary to deliver pulses of precursor vapor to the reaction chamber in such systems. Furthermore, precursor material delivery systems in accordance with various embodiments may accept precursors originating in any of a number of different forms, including solid, liquid, gas, fluid, slurry, powder, and mixtures thereof.

It will be obvious to those having skill in the art that many changes may be made to the details of the above-described embodiments without departing from the underlying principles of the invention. The scope of the present invention should, therefore, be determined only by the following claims.

The invention claimed is:

1. A precursor delivery system for delivering pulses of vaporized precursor material to a reaction space in a thin film deposition system, comprising:
   a precursor container for holding a supply of precursor material;
   a flow path from the precursor container to the reaction space;
   a pulse control device interposed between the precursor container and the reaction space, the pulse control device adapted to selectively release pulses of the precursor material toward the reaction space via the flow path; and
   a high conductivity particle filter interposed in the flow path between the precursor container and the reaction space, the high conductivity particle filter including at least one inertial trap adjacent the flow path for filtering particles from the precursor material without significantly restricting flow of the pulses through the flow path.

2. The system of claim 1, further comprising a vacuum source coupled to the precursor container via a vacuum flow path for controlling a pressure within the precursor container.

3. The system of claim 2, further comprising a vacuum shut-off valve operably interposed between the vacuum source and the precursor container for selectively interrupting the vacuum flow path.

4. The system of claim 3, further comprising a vacuum filter interposed in the vacuum flow path between the precursor container and the vacuum shut-off valve.

5. The system of claim 4, in which the high conductivity particle filter is included in the vacuum filter.

6. The system of claim 2, further comprising an isolation valve interposed between the precursor container and the reaction space for sealing the flow path downstream from the precursor container to facilitate adjustment of the pressure in the precursor container via the vacuum source.

7. The system of claim 1, in which the high conductivity particle filter further includes:
   an inlet coupled to an upstream portion of the flow path;
   an outlet coupled to a downstream portion of the flow path;
   a filter passage in communication with the inlet and the outlet, the filter passage including multiple turns between the inlet and the outlet; and
   in which the inertial trap communicates with the filter passage and is positioned in proximity to one of the turns so that the inertia of the particles causes the particles to travel into the trap as the precursor material flows through the filter passage through said turn, thereby preventing the particles from passing into the reaction space.

8. The system of claim 7, in which at least some of the turns of the filter passage form a spiral.

9. The system of claim 7, in which the turns are defined by a series of baffles between the inlet and the outlet.

10. The system of claim 7, in which the turns are defined by a set of nested tubes having nonaligned side apertures extending through the sides of the tubes.

11. The system of claim 1, further comprising at least one high efficiency particle filter positioned in the flow path downstream from the high conductivity particle filter and upstream from the pulse control device.

12. The system of claim 1, further comprising:
   means for vaporizing the precursor material upstream from the reaction space.

13. The system of claim 12, in which the means for vaporizing includes a vacuum source coupled to the precursor container via a vacuum flow path.

14. The system of claim 13, further comprising a vacuum shut-off valve operably interposed between the vacuum source and the precursor container for selectively closing the vacuum flow path.

15. The system of claim 12, in which the means for vaporizing includes a heater thermally associated with the precursor container.

16. The system of claim 1, in which the pulse control device includes a pulse valve.

17. The system of claim 16, in which the pulse control device includes a diffusion baffler operably connected to the flow path downstream from the pulse valve for preventing leakage from the pulse valve from reaching the reaction space.

18. The system of claim 1, in which the pulse control device includes an inert gas valve operably coupled to the flow path.

19. The system of claim 1, further comprising a staging volume interposed in the flow path downstream from the precursor container and upstream from the reaction space for holding at least one dose of precursor material, the staging volume selectively isolatable from the precursor container and selectively isolatable from the reaction space.

20. The system of claim 19, further comprising a supply of inert boost gas coupled to the staging volume.

21. The system of claim 19, further comprising a pulse valve positioned in the flow path downstream from the staging volume.

22. The system of claim 19, in which the staging volume is positioned in the flow path downstream from the high conductivity particle filter.

23. The system of claim 22, further comprising one or more high efficiency particle filters interposed between the high conductivity particle filter and the staging volume.

24. The system of claim 22, further comprising a second high conductivity particle filter interposed in the flow path between the staging volume and the reaction space.

25. The system of claim 19, in which the staging volume is sufficiently large so that the release of a single pulse of the precursor material causes a pressure inside the staging volume to decrease no more than 50 percent.

26. The system of claim 1, in which the precursor container and the flow path are formed in one or more solid blocks of thermally conductive material, said one or more blocks together forming an elongate thermally conductive body extending from the precursor container to the reaction space.

27. The system of claim 26, further comprising at least one heater in thermal association with the thermally conductive body for maintaining a temperature gradient along the flow path that increases toward the reaction space.

28. The system of claim 1, in which the thin film deposition system is an atomic layer deposition system.

29. A method of delivering pulses of a precursor vapor to a reaction space in a thin film deposition system, comprising:
  providing a supply of precursor material;
  establishing a flow path from the supply of precursor material to the reaction space;
  vaporizing at least a portion of the precursor material to form a precursor vapor;
  selectively releasing pulses of the precursor vapor through the flow path and toward the reaction space; and
  filtering the precursor vapor between the supply of precursor material and the reaction space, including directing the precursor vapor through a filter passage having multiple turns, at least one of the turns being positioned in proximity to an inertial trap in communication with the filter passage so that inertia of particles carried into the filter passage by the precursor vapor causes the particles to travel into the trap as the precursor vapor flows through said turn.

30. The method of claim 29, in which the vaporizing of the precursor material includes heating the supply of precursor material.

31. The method of claim 30, further comprising storing the supply of precursor material in a precursor container and drawing a vacuum inside the precursor container.

32. The method of claim 31, in which the drawing of the vacuum inside the precursor container is accomplished via a vacuum flow path that bypasses the reaction space.

33. The method of claim 32, further comprising filtering particles from the vacuum flow path.

34. The method of claim 29, further comprising establishing a staging volume selectively isolatable from the supply of precursor material and selectively isolatable from the reaction space.

35. The method of claim 29, in which the pulses of precursor vapor are released by a pulse valve, and further comprising providing a controlled backflow of inert gas in the flow path downstream from the pulse valve to prevent leakage from the pulse valve from reaching the reaction space when the pulse valve is closed.

36. The method of claim 29, in which the thin film deposition system is an atomic layer deposition system.

* * * * *

UNITED STATES PATENT AND TRADEMARK OFFICE
CERTIFICATE OF CORRECTION

| | |
|---|---|
| PATENT NO. | : 7,141,095 B2 |
| APPLICATION NO. | : 10/660365 |
| DATED | : November 28, 2006 |
| INVENTOR(S) | : Bradley J. Aitchison et al. |

It is certified that error appears in the above-identified patent and that said Letters Patent is hereby corrected as shown below:

In the claims:

Col. 23, replace claim 17 with the following claim 17:

17. The system of claim 16, in which the pulse control device includes a diffusion barrier operably connected to the flow path downstream from the pulse valve for preventing leakage from the pulse valve from reaching the reaction space.

Signed and Sealed this

Seventh Day of August, 2007

JON W. DUDAS
*Director of the United States Patent and Trademark Office*